United States Patent
Williams

[11] Patent Number: 6,060,752
[45] Date of Patent: May 9, 2000

[54] ELECTROSTATIC DISCHARGE PROTECTION CIRCUIT

[75] Inventor: Richard K. Williams, Cupertino, Calif.

[73] Assignee: Siliconix, Incorporated, Santa Clara, Calif.

[21] Appl. No.: 09/002,179

[22] Filed: Dec. 31, 1997

[51] Int. Cl.[7] .................................................. H01L 23/62
[52] U.S. Cl. ........................ 257/355; 257/361; 257/491
[58] Field of Search .................................. 257/355, 356, 257/357, 358, 359, 361, 362, 491

[56] References Cited

U.S. PATENT DOCUMENTS

| 5,510,947 | 4/1996 | Pellegrini et al. | 257/355 |
|---|---|---|---|
| 5,736,779 | 4/1998 | Kobayashi | 257/355 |

FOREIGN PATENT DOCUMENTS

| 5-121679 | 5/1993 | Japan | 257/355 |
|---|---|---|---|
| 6-188360 | 7/1994 | Japan | 257/355 |

*Primary Examiner*—Donald L. Monin, Jr.
*Attorney, Agent, or Firm*—Skjerven, Morrill, MacPherson, Franklin & Friel; David E. Steuber

[57] ABSTRACT

An electrostatic discharge (ESD) protection circuit includes diodes connected in series back-to-back between the signal input and power supply terminals of the circuit to be protected. This allows the input signal to rise a selected distance above the supply voltage without triggering the ESD protection circuit. The ESD protection circuit can be fabricated in integrated form, with the diodes including a pair of P+ regions in an N-well or separate P+ regions forming PN junctions with separate N-wells. The diodes may also be formed in a layer of polysilicon over a field oxide region. Optionally, a second pair of back-to-back diodes can be connected between the signal input terminal and ground. This permits the input signal to fall a selected distance below ground without triggering the ESD protection circuit.

30 Claims, 21 Drawing Sheets

(a)

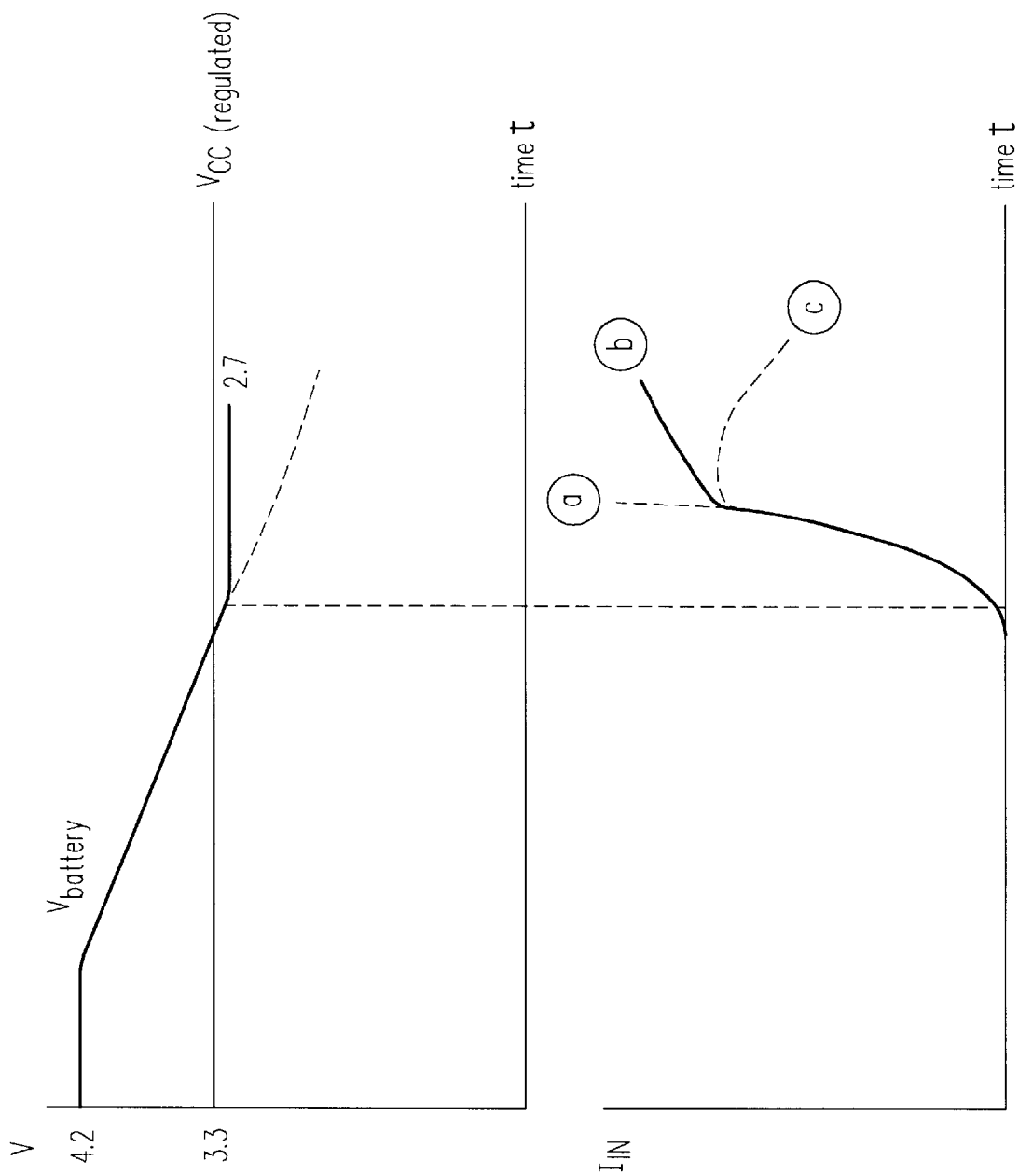

ELECTROSTATIC DISCHARGE PROTECTION CIRCUIT

FIELD OF THE INVENTION

This invention relates to circuitry for protecting another circuit against damage resulting from excessively high or low voltage swings such as those created by electrostatic discharges, particularly voltage swings which rise to a level that is above the supply voltage providing power to the circuit.

BACKGROUND OF THE INVENTION

It is known to protect a circuit such as an integrated circuit from damage from electrostatic discharges (ESDs). Many of these known techniques, however, do not protect the circuit against input signals which create a voltage that is above the supply voltage that powers the circuit to be ESD protected.

An example of such a prior art circuit is shown in FIG. 1A, wherein an ESD protection circuit 10 provides protection at an input terminal of an inverter 12. ESD protection circuit 10 includes diodes D1 and D2, with diode D1 connected between the input terminal 14 and ground and diode D2 connected between the input terminal 14 and the positive supply voltage $V_{CC}$. Inverter 12 is of a conventional CMOS structure and contains an N-channel low-side MOSFET M1 and a P-channel high-side MOSFET M2. The input signal $V_{in}$ is applied to the input terminal 14, and in a known manner inverter 12 produces an inverted output signal $V_{out}$ at output terminal 16. Diode D3 can be a diode associated with the structure whereby the MOSFETs M1 and M2 are formed, particularly the N-well in which the P-channel MOSFET M2 is formed. When integrating the circuit monolithically, diode D3 may unavoidably be formed unless the IC is produced in oxide (dielectrically) isolated processes which eliminate the junctions between the well diffusions and between the well diffusions and the underlying substrate. Thus diode D3 may be a parasitic diode or may be added to the circuit by design.

$V_{in}$ and $V_{out}$ are shown in FIG. 1B. If $V_{in}$ is going from zero to $V_{CC}$, then somewhere near the halfway point ($V_{CC}/2$) $V_{out}$ swings from $V_{CC}$ to zero. The reverse occurs when $V_{in}$ travels from $V_{CC}$ to zero.

Since $V_{in}$ is normally at or below $V_{CC}$, diode D1 is usually reverse-biased (although it could occasionally be zero-biased when $V_{in}$ is at ground potential). Likewise, diode D2 is normally reverse-biased except in the case where $V_{in}=V_{CC}$. Diode D3 is reverse-biased so long as a $V_{CC}$ is present.

Inverter 12 could be any circuit to be protected, and this is made clear in FIG. 2A which shows a generic circuit 20 being protected by ESD protection circuit 12.

FIGS. 2B–2F illustrate the circuit of FIG. 2A in operation, with an ESD pulse modeled as a network 22 containing a capacitor C1 charged to some generated voltage $V_{gen}$ in series with a resistor R1 and a switch S1. When the switch S1 is thrown, capacitor C1 discharges through resistor R1, and an ESD pulse having a voltage of $V_{ESD}$ appears at the terminals of the network 22. $V_{ESD}$ could vary from hundreds to thousands of volts, for example. It should be noted that while VESD can reach thousands of volts, the amount of energy contained in capacitor C1 is small because the capacitance and stored charge (Q=CV) associated with an ESD pulse is relatively small.

FIGS. 2B and 2C illustrate the situation where the ESD pulse is applied between the input terminal 14 and ground. This could occur, for example, when the chip is picked up, before it is plugged into a circuit board and before it is connected to a power supply. In FIG. 2B the positive side of the ESD pulse is applied to the input terminal 14, and diode D1 breaks down to protect circuit 20, which is exposed to a voltage equal to the breakdown voltage of diode D1 ($BV_{D1}$). The input to circuit 20 frequently contains a small transistor with a very thin gate oxide layer, which would be destroyed if it were exposed to the voltage surge that would be present at the input if diode D1 were not present. A current $I_{ESD}$ flows through diode D1 in the reverse direction. In FIG. 2C the negative side of the ESD pulse appears at input terminal 14 and circuit 20 is exposed to the forward voltage drop across diode D1 (usually in the range of 0.6–1.0 V).

In FIGS. 2D–2F the ESD pulse is applied between the input terminal 14 and the power supply $V_{CC}$. FIG. 2D illustrates the situation where the positive side of the pulse is applied to the input terminal 14 and the other terminals are left floating. As shown, diode D2 is forward biased and circuit 20 is exposed to the forward voltage drop across diode D2 (0.6–1.0 V).

When the negative side of the ESD pulse is applied to the input terminal 14, two situations could occur. One possibility, shown in FIG. 2E, is that diode D2 breaks down, and the current $I_{ESD}$ flows through diode D2 in the reverse direction, subjecting circuit 20 to the breakdown voltage of diode D2. Alternatively, as shown in FIG. 2F, diode D3 could break down and the current $I_{ESD}$ could flow in the forward direction through diode D1. In such ESD tests the ground pin is assumed to be floating although in actual applications it may be connected to other circuits. The latter is the preferred discharge path if the sum of the breakdown voltage of diode D3 and the forward voltage drop across diode D1 is less than the breakdown voltage of diode D2.

Diode D3 could be part of a parasitic bipolar transistor with some type of resistive emitter to base short (see FIG. 3A). So not only is a PN junction present but a diode which, when it breaks down, causes a base current to flow and the bipolar transistor to snap back. This reduces the voltage across the device to a sustaining voltage that is below the actual breakdown voltage of the diode itself. This is favorable from the standpoint both of protecting circuit 20 from ESD and limiting the heat generated in the diode, since the current will be the same but the voltage will be less than the breakdown voltage of the diode. Diode D3 could also be a part of a MOSFET in which, by the field plate effect, the breakdown voltage of the diode is lowered (see FIG. 3B). In this case the MOSFET has to be designed such that the gate induces break down in the silicon but still is not subjected to so many hot carriers that the gate oxide itself is destroyed. Generally, the diodes shown in FIGS. 3A and 3B are part of the bipolar or MOSFET protection device, but in other arrangements additional diodes may be connected in parallel with the bipolar or MOSFET to form a current divider, thereby controlling the snapback point.

In a case where a parasitic bipolar transistor snaps back (as shown in FIG. 3C) or a MOSFET experiences field plate induced breakdown, the voltage starts out at a voltage above $V_{CC}$ and the current increases until it reaches a level where in the device snaps back and the voltage falls to a sustaining voltage $V_{sustain}$ below $V_{CC}$ and within a range in which the device is normally operated (the hatched area in FIG. 3C).

This mechanism could not be invoked during normal operation or else the device could blow up. Snapback during an ESD pulse is acceptable because the energy contained in the ESD pulse is relatively small. If a condition of longer duration and greater energy causes the snapback, the device will overheat and probably blow up. Thus ESD protection devices cannot survive overvoltage or overcurrent conditions stresses for prolonged intervals, despite their ability to protect against the high voltages of ESD transients.

With ESD protection circuit 10 a problem can occur in a circuit of the kind shown in FIG. 4. Here circuit 20 is powered by a $V_{battery}$ directly from a battery 44, while the input signal $V_{IN}$ is generated by a CMOS buffer stage 42 which is supplied by a DC/DC converter 40. The component in circuit 20 supplied by $V_{IN}$ could be, for example, a microprocessor or a custom chip which requires a precisely regulated supply voltage, while the component of circuit 20 to be protected against ESD could be another IC containing digital, analog or even power devices intended to run directly off the battery. In this scenario one would want to supply the power chip with the raw battery voltage $V_{battery}$ to avoid the power losses and unwanted heat generation inherent in DC/DC regulator 40 if DC/DC generator 40 were to supply power to both CMOS buffer stage 42 and circuit 20. This would typically be the case if circuit 20 were a circuit that draws high currents, such as a high-current motor drive IC or a radio frequency power amplifier used in a cell phone.

The voltage supplied to buffer stage 42 is designated $V_{CC}$. The ESD diodes D1 and D2 cause no problem so long as $V_{CC}$ is no greater than $V_{battery}$. If $V_{battery}$ decays, however, and DC/DC converter 40 is still able to maintain a constant output VccF then $V_{battery}$ may actually fall below $V_{CC}$. $V_{IN}$, the output of buffer 42 and the input to circuit 20, could then be above $V_{battery}$ and diode D2 could become forward-biased. The result could be improper circuit operation or damage to either or both of circuit 20 and buffer 42.

This malfunction is illustrated in FIGS. 5A and 5B. FIG. 5A shows $V_{battery}$ falling over time from 4.2 V to a level which is below the $V_{CC}$ generated by DC/DC converter 40, which is assumed here to be 3.3 V. As shown in FIG. 5B, as soon as $V_{battery}$ falls below $V_{CC}$, a small leakage current ($I_{IN}$) begins to flow from buffer stage 42 and through diode D2. When $V_{battery}$ reaches about 2.7 V, diode D2 becomes fully conductive and clamps $V_{battery}$ at 2.7 V. $I_{IN}$ then begins to rise rapidly. Depending on the output filter capacitance and the energy stored in DC/DC converter 40, several scenarios could occur. If there is enough capacitance, the current could continue to rise rapidly (curve a) and the diode D2 could fail. The current could be somehow limited (curve b), e.g., by series resistance, so that it would continue to flow through diode D2 for some period of time until the $V_{battery}$ continues to decay and $V_{CC}$ is driven out of regulation. Or, the battery 44 could have so much resistance that in fact the whole system begins to fail and the current begins to decline.

Accordingly, there is a need for an ESD protection circuit which does not conduct when the input voltage rises to a level substantially above the supply voltage or falls to a level substantially below ground.

SUMMARY OF THE INVENTION

An ESD protection circuit in accordance with this invention includes diodes connected in series between the voltage input terminal and the supply terminal of the circuit to be protected. The diodes are connected in opposite directions, that is, either anode-to-anode or cathode-to-cathode. Optionally, the circuit may include diodes serially connected in opposite directions between other terminals of the circuit to be protected, e.g., the voltage input terminal and ground.

As the input voltage rises, the diode that is reverse-biased breaks down at a level that can be controlled and can be above the supply voltage. Conversely, the breakdown voltage of the other diode determines how low the input voltage can go before current flows through that diode. Thus the input voltage can vary to predetermined high or low levels without destroying the protective diodes. On the other hand one of the diodes always breaks down in the presence of a positive or negative ESD pulse.

The diodes may be fabricated integrally either as separate components or with a shared anode or cathode. In the latter event, a parasitic bipolar transistor may be formed. The formation of a parasitic bipolar transistor can improve ESD performance subject to restrictions in the snapback characteristics of the bipolar transistor. Specifically, snapback should not occur in the parasitic bipolar transistor in the current range required by normal operation.

BRIEF DESCRIPTION OF THE DRAWINGS

The invention will be understood by reference to the following drawings, in which like components have the same reference numeral.

FIGS. 5A and 5B illustrate graphs showing the voltages and current, in the circuitry shown in FIG. 4.

DESCRIPTION OF THE INVENTION

Figure 1A:
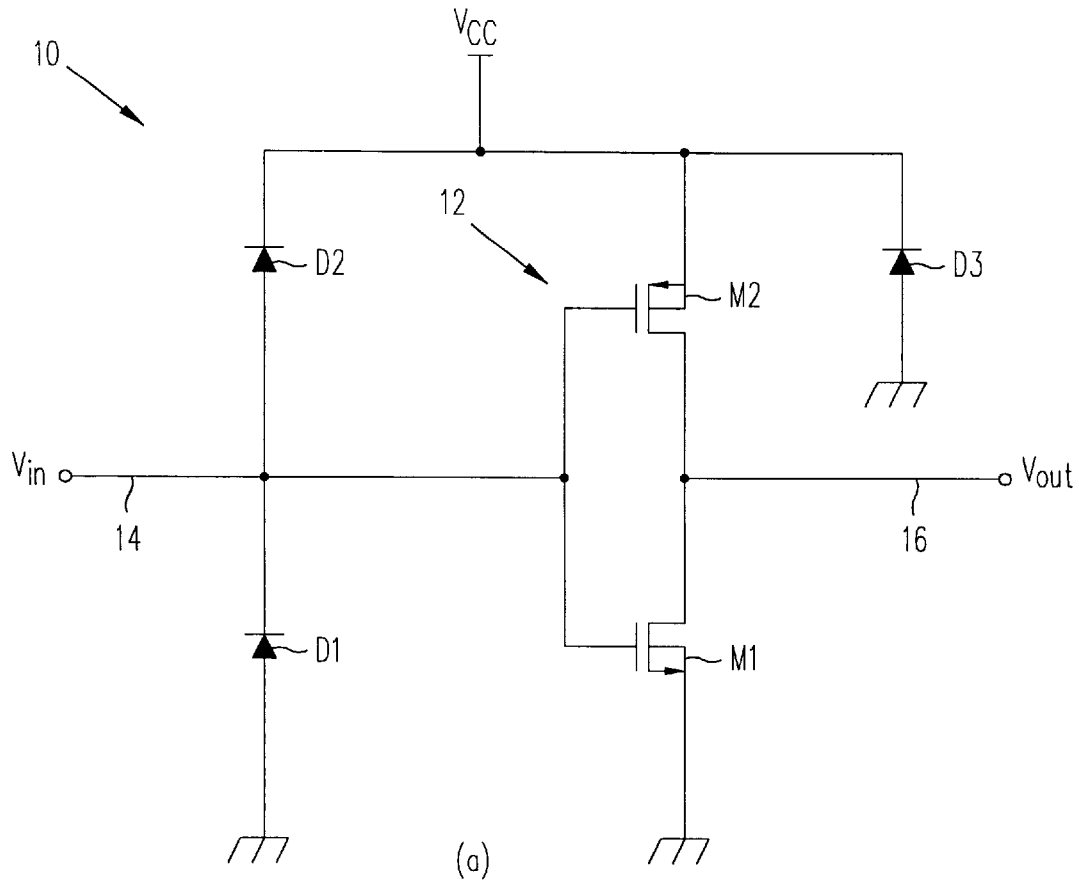
FIG. 1A illustrates a circuit diagram of a prior art ESD protection circuit arranged to protect a CMOS inverter.
Figure 1B:
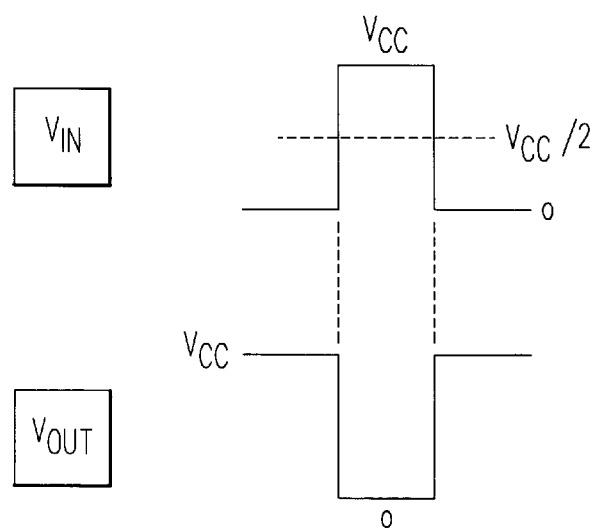
FIG. 1B illustrates a graph showing the input and output voltages of the circuit shown in FIG. 1A.
Figure 2A:
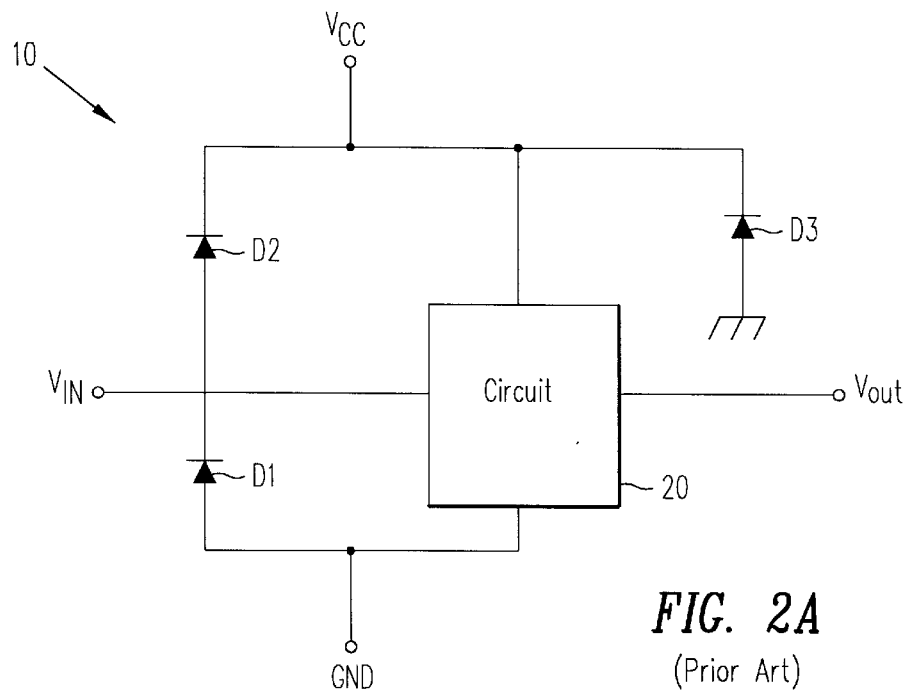
FIG. 2A illustrates a circuit diagram of a prior art ESD protection circuit arranged to protect a generic circuit.
Figure 2B:
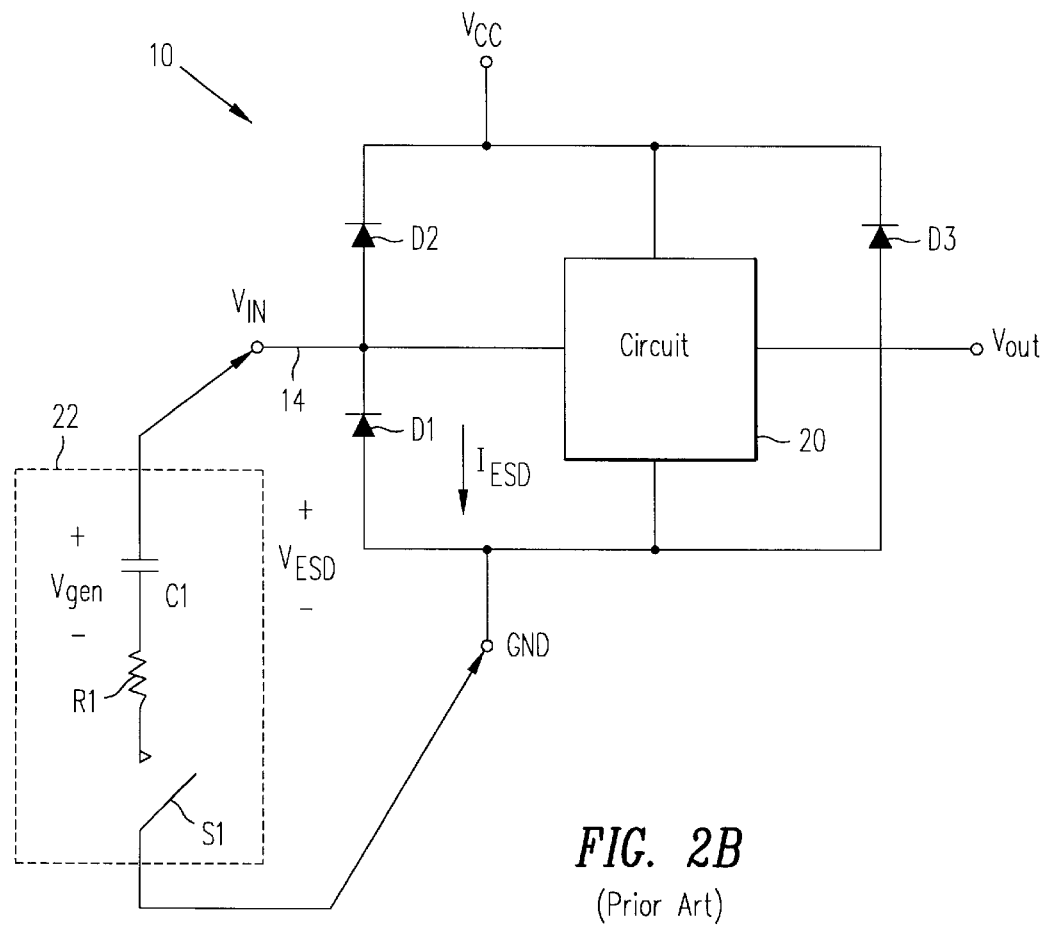
FIGS. 2B–2F illustrate various ESD pulses applied to the circuit of FIG. 2A.
Figure 2C:
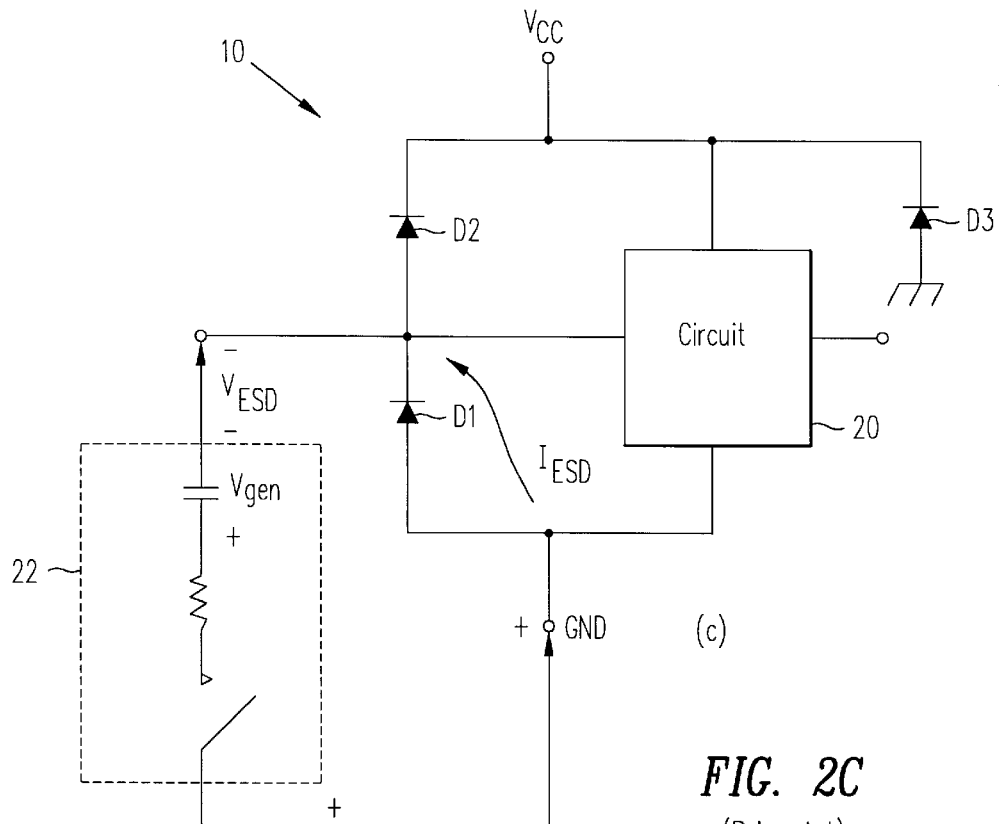
Figure 2D:
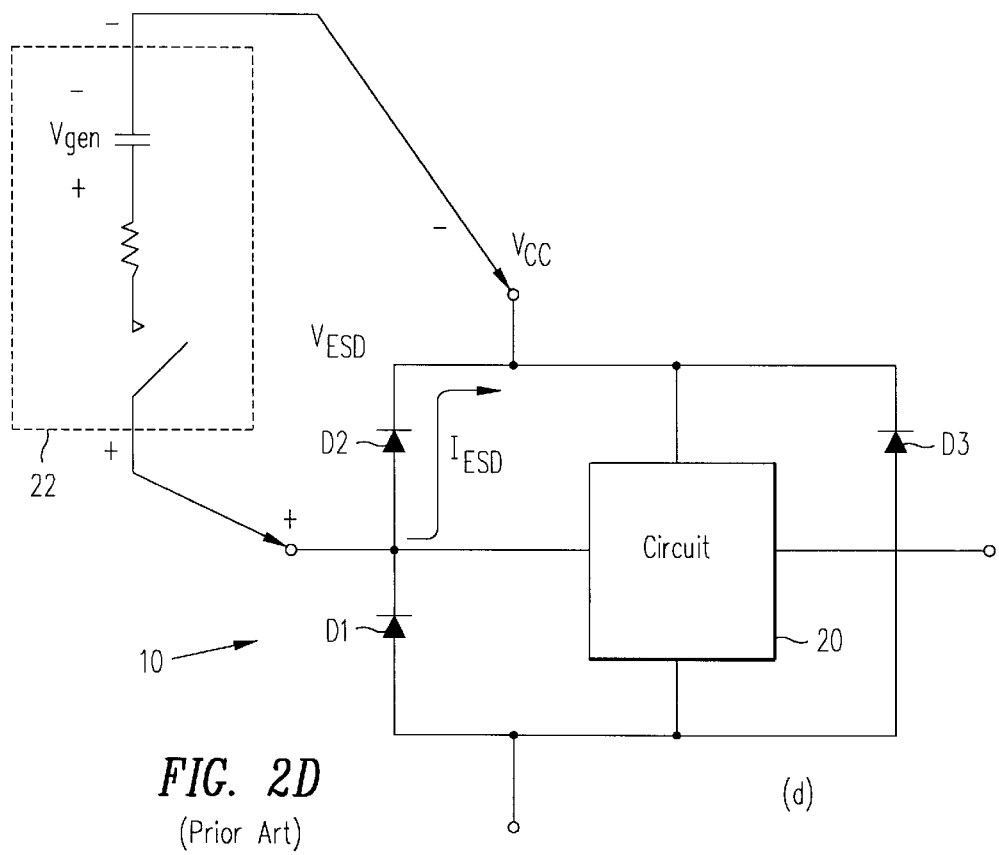
Figure 2E:
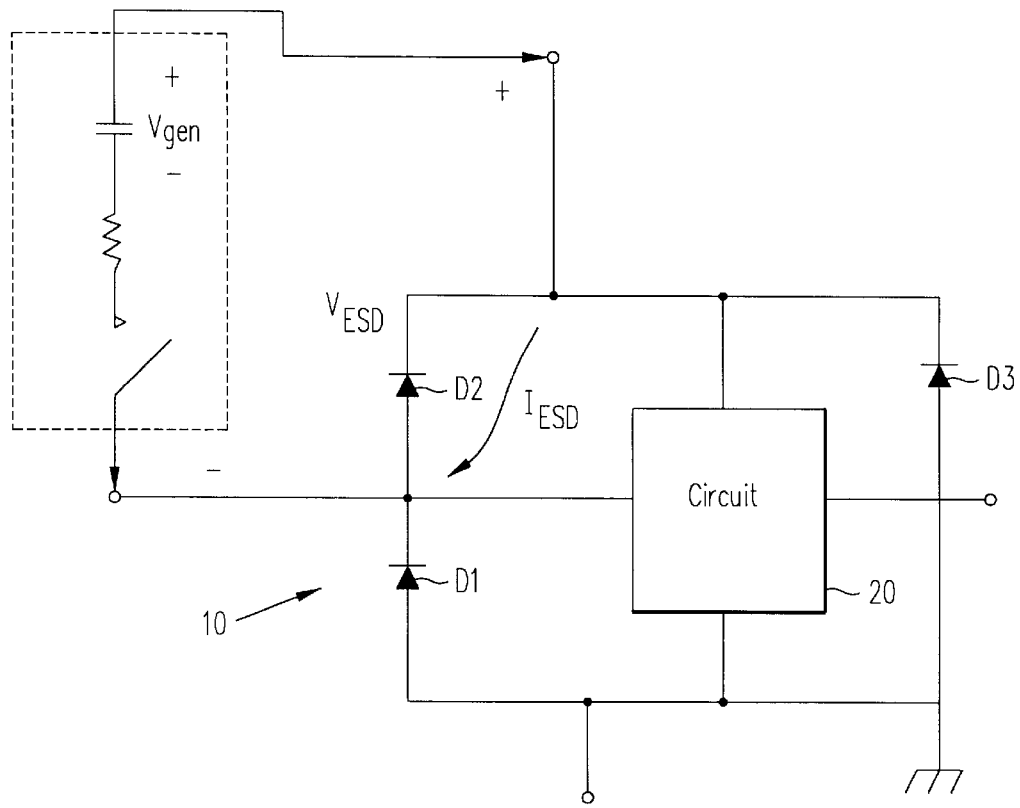
Figure 2F:
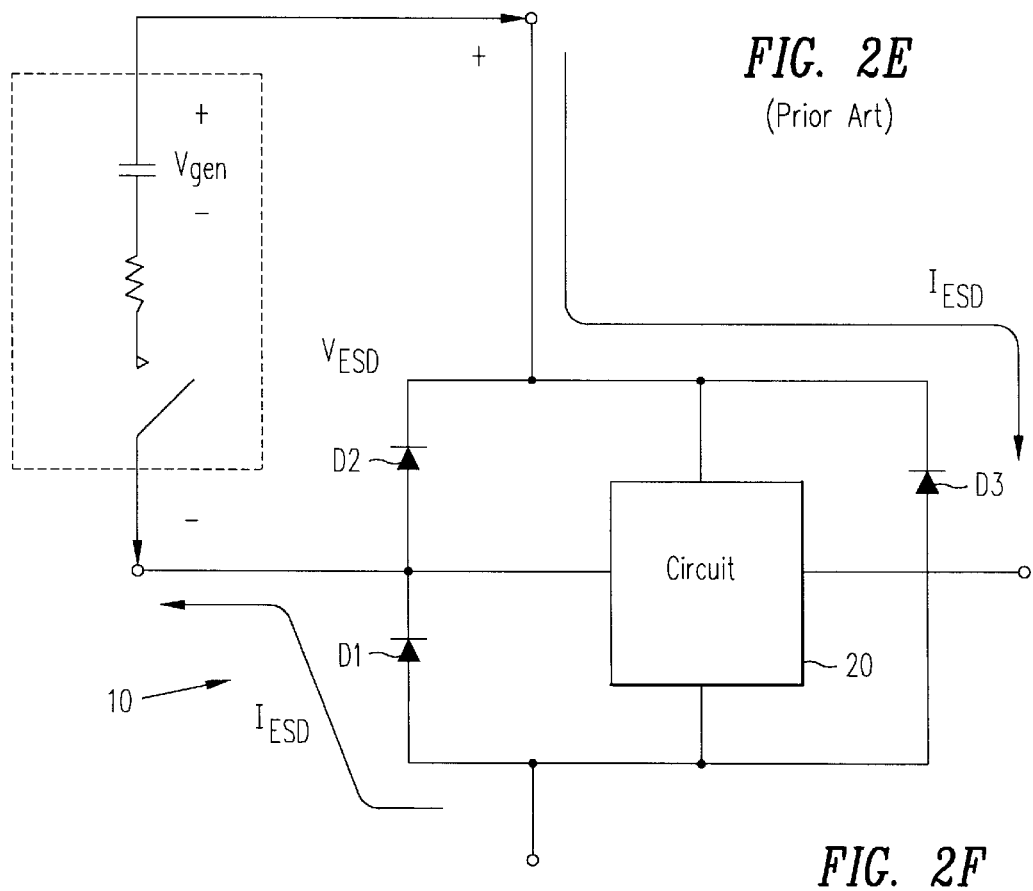
Figure 3A:
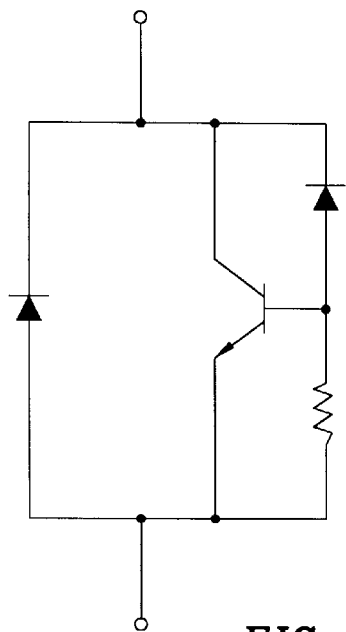
FIGS. 3A and 3B illustrate equivalent circuit diagrams (in the form of a bipolar transistor and a MOSFET, respectively) of the diode between the supply voltage and ground shown in FIGS. 2A–2F.
Figure 3B:
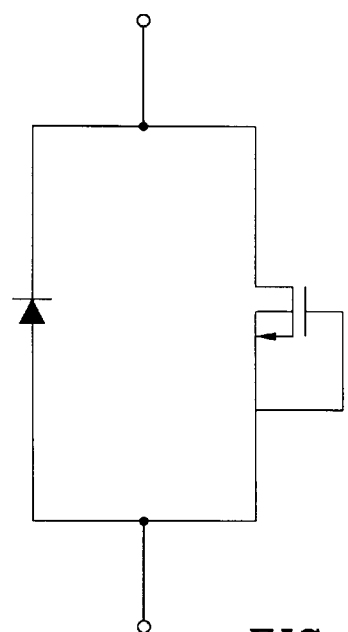
Figure 3C:
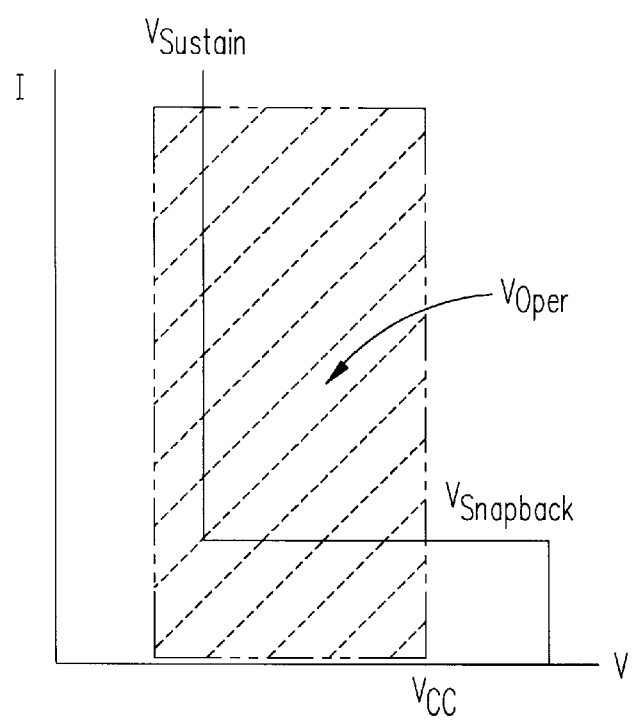
FIG. 3C illustrates a graph showing the current through the diode of FIGS. 3A and 3B as a function of voltage.
Figure 4:
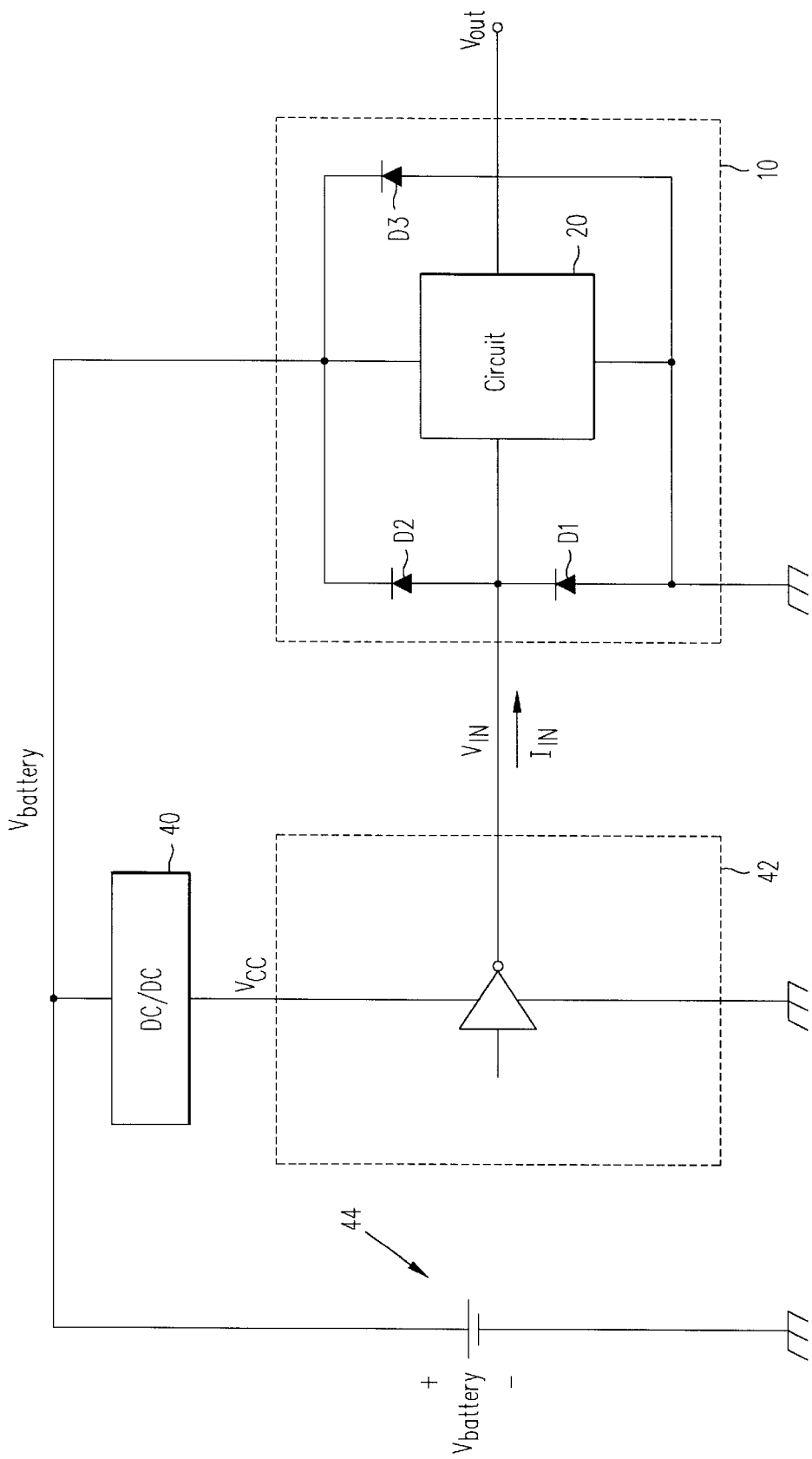
FIG. 4 illustrates a circuit diagram of a ESD protection circuit and protected circuit where the input voltage is generated by an inverter supplied by a DC/DC converter.
Figure 6A:
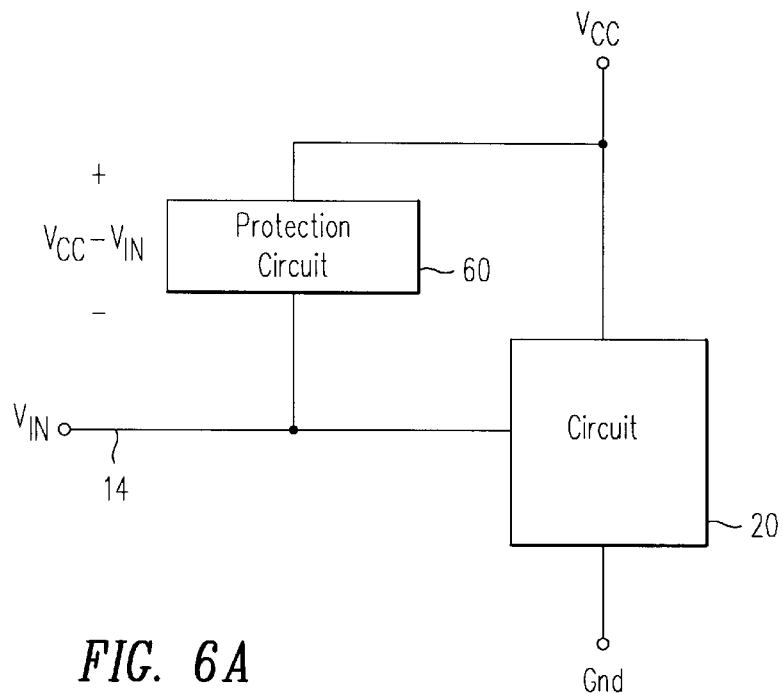
FIG. 6A illustrates a block diagram showing a protected circuit and an ESD protection circuit in accordance with this invention.
Figure 6B:
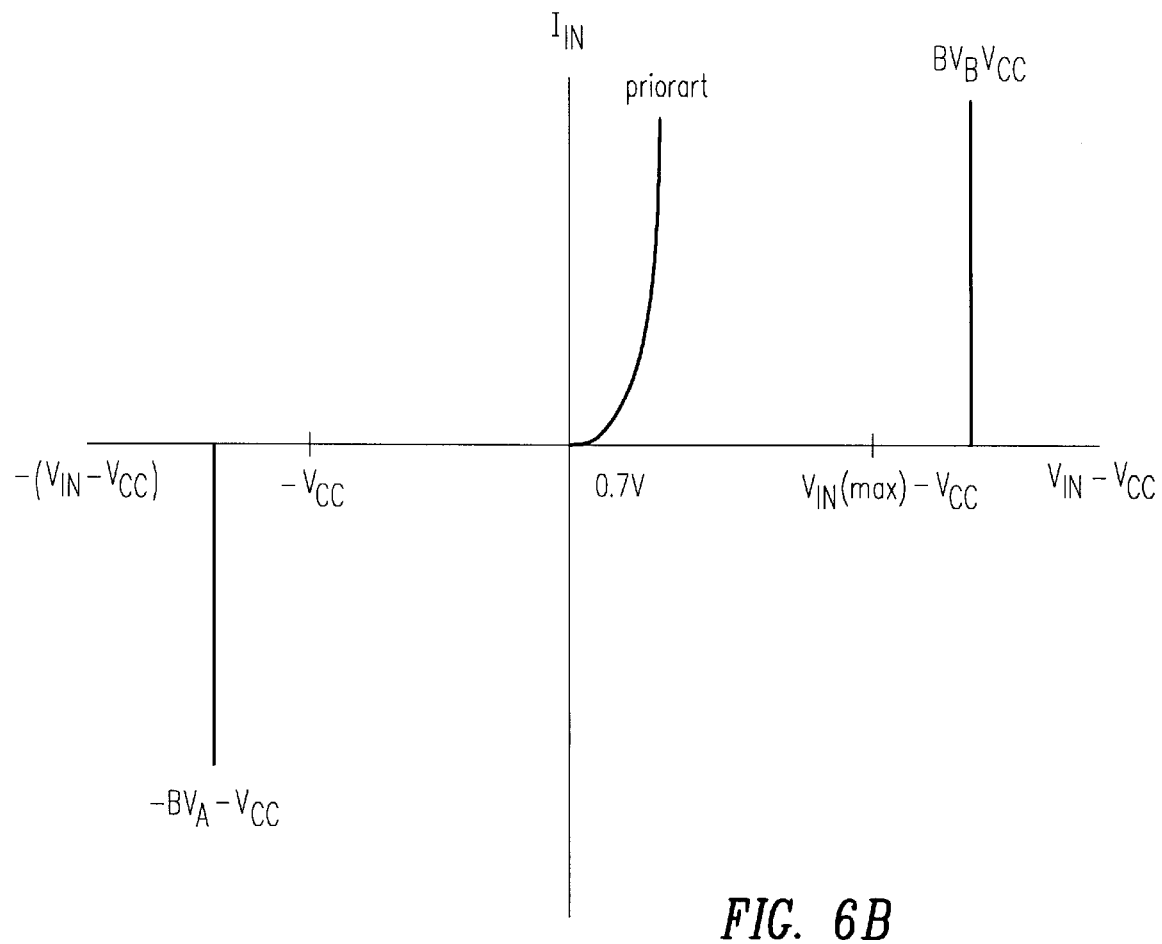
FIG. 6B illustrates a graph showing the current through the ESD protection circuit of FIG. 6A as a function of voltage.

FIG. 6B is a graph showing the breakdown characteristics of an ideal ESD protection circuit 60 shown in FIG. 6A, connected between the input terminal 14 and the $V_{CC}$ terminal of circuit 20. On the vertical axis is shown the current ($I_{IN}$) through protection circuit 60 and on the horizontal axis is shown the value of $V_{IN}$ relative to $V_{CC}$ ($V_{IN}-V_{CC}$). With decreasing $V_{IN}-V_{CC}$, ESD protection circuit 60 does not begin to conduct until $V_{IN}-V_{CC}$ reaches a value $-(BV_A-V_{CC})$, which is below ground ($-V_{CC}$ in FIG. 6B, since the origin of the graph is where $V_{IN}=V_{CC}$). With increasing $V_{IN}-V_{CC}$, ESD protection circuit 60 does not begin to conduct until $V_{IN-VCC}$ reaches a value $BV_B-V_{CC}$, where $BV_B$ is above a maximum value of value of $V_{IN}=V_{IN}$ (max) As shown, prior art ESD protection circuits such as circuit 10 shown in FIG. 1A become conductive when $V_{IN}$ exceeds $V_{CC}$ by only about 0.7 V.

Figure 7A:
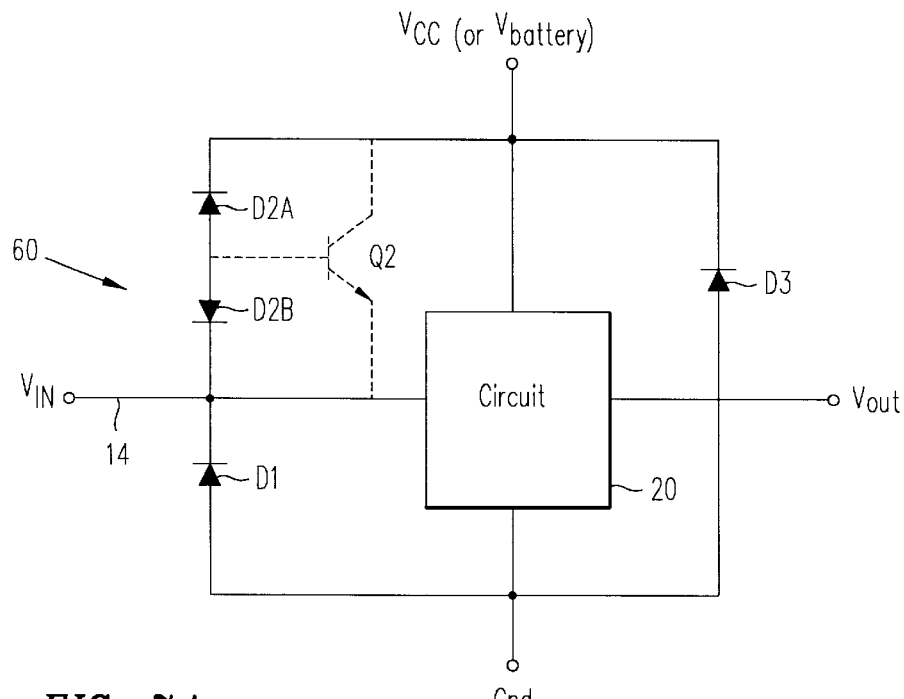
FIG. 7A illustrates a circuit diagram of an ESD protection circuit in accordance with the invention.

FIG. 7A illustrates a circuit diagram of one embodiment of the invention. As shown, ESD protection circuit 60 includes diodes D2A and D2B which are connected in series back-to-back (i.e., anode-to-anode) between input terminal 14 and the supply terminal $V_{CC}$ (or $V_{battery}$). Since diodes connected back-to-back normally do not conduct in either direction, circuit 60 is an AC blocking device. Diodes D1 and D3 in FIG. 7A are unchanged from the circuits described above. Diode D3 may be omitted but in most embodiments will be present.

Figure 7B:
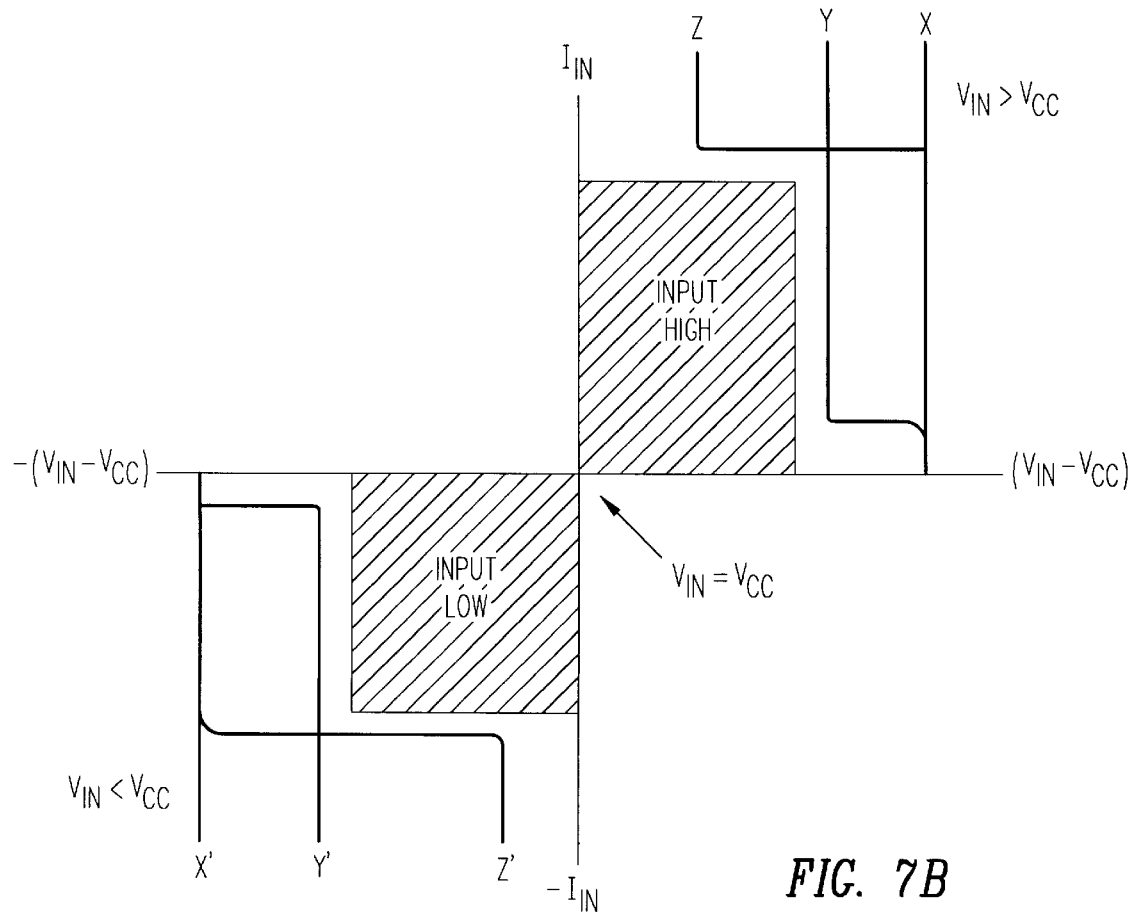
FIG. 7B illustrates a graph showing the permissible operating conditions of the circuit shown in FIG. 7A.

Depending on how diodes D2A and D2B are fabricated, they may or may not form a parasitic bipolar transistor Q2 (shown in dashed lines). If a parasitic bipolar transistor is formed, it will be subject to snap back. FIG. 7B is a graph of current as a function of voltage which illustrates several possibilities. The hatched areas above and below $V_{CC}$ (represented by the vertical axis) represent the region of normal operation of circuit 20. The region to the right of the vertical axis indicates that the input voltage $V_{IN}$ can exceed the supply voltage $V_{CC}$. So long as the current and voltage are within these regions neither diode D2A nor diode D2B should break down. The curves labeled X and X' represent the situation where either the parasitic bipolar transistor Q2 does not exist or does not snap back. The diodes D2A and D2B thus break down at voltages which are outside the normal operating range and remain in this condition to any reasonable current density.

The remaining curves exemplify the two permissible conditions that can prevail if the parasitic transistor Q2 exists and is subject to snapback. Curves Y and Y' illustrate transistor Q2 snapping back to sustaining voltages that are still outside the normal operating voltage ranges. Curves Z and Z' illustrate transistor Q2 snapping back to voltages that are within the operating voltage range but at currents that are so high that they are outside the currents that would normally be expected at the input terminal 14. The diodes could not handle such high currents for extended periods of time, for example, from milliseconds to seconds, but can tolerate high currents for the short durations ranging from nanoseconds to microseconds that are typical of ESD pulses.

The required component sizes for various operating conditions of the circuit shown in FIG. 7A are summarized in the table shown in Appendix A.

As shown in Appendix A, if the maximum voltage is $V_{IN}(max)>V_{CC}$ the breakdown voltage of diode D1 must be set at or above $V_{IN}(max)$ plus a manufacturing tolerance indicated as $\Delta V$. This differs from the conventional circuit shown in FIG. 1A in that there diode D1 need not have a breakdown voltage greater than $V_{CC}$, since $V_{IN}$ is not expected to exceed $V_{CC}$ by more than a forward-biased diode drop (i.e., approximately 0.7 V). With the circuit of FIG. 7A, however, $V_{CC}$ could be at 5 V and $V_{IN}$ could go as high as 12 V, for example, in which case diode D1 would have to be a 13 V diode. Otherwise, when $V_{IN}$ gets to 6 V or so, diode D1 would begin to conduct.

The breakdown voltage of diode D3 is based on the level of $V_{CC}$, which can vary if the protective circuit is to be used for a variety of supply voltages. In Appendix A, $V_{CC}(max)$ designates the maximum expected supply voltage and again $\Delta V$ is a manufacturing tolerance. The breakdown voltage of diode D3 must be above $V_{CC}(max)+\Delta V$. The most negative $V_{IN}$ is $-0.7$ V (where diode D1 begins to forward conduct); therefore, the breakdown voltage of diode D2A must be set at or above $V_{CC}(max)+0.7$ V. The forward voltage drop across diode D2B serves as a guard band and obviates the need for a manufacturing tolerance in this case.

The breakdown voltage of diode D2B must be set at or above $V_{IN}(max)-V_{CC}(min)$, where $V_{CC}(min)$ is the lowest anticipated supply voltage. The forward voltage drop across diode D2A provides an effective guard band, so no manufacturing tolerance is necessary.

If diodes D2A and D2B function as a parasitic bipolar transistor Q2, then the sustaining voltages of the transistor in the event of snapback must be equivalent to the breakdown voltages of diodes D2A and D2B.

If it is desired to allow $V_{IN}$ to go below $-0.7$ V, back-to-back diodes comparable to diodes D2A and D2B would be substituted for diode D1.

Figure 8A:
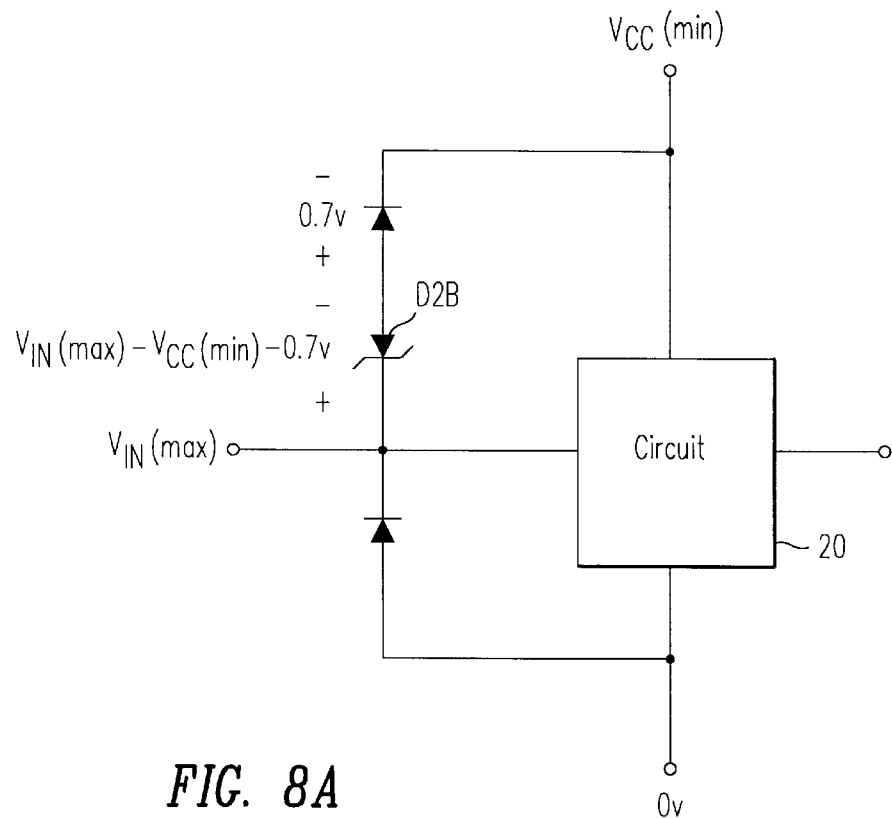
FIGS. 8A and 8B are circuit diagrams illustrating extreme conditions to which the ESD protection circuit can be exposed.
Figure 8B:
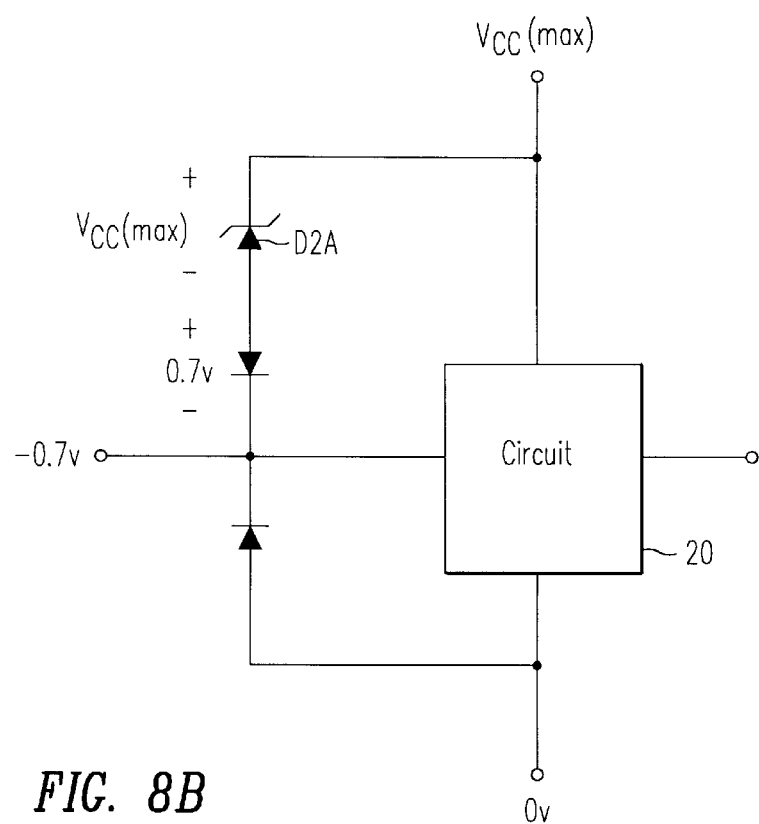

FIGS. 8A and 8B illustrate two extreme conditions to which the ESD protection circuit 60 may be exposed. In FIG. 8A, $V_{IN}$ is at its maximum value and $V_{CC}$ is at its minimum value. In FIG. 8B, $V_{CC}$ is at its maximum value and $V_{IN}$ is at its minimum value of $-0.7$ V.

FIGS. 9A–9E illustrate cross-sectional views of several exemplary embodiments of the invention.

Figure 9A:
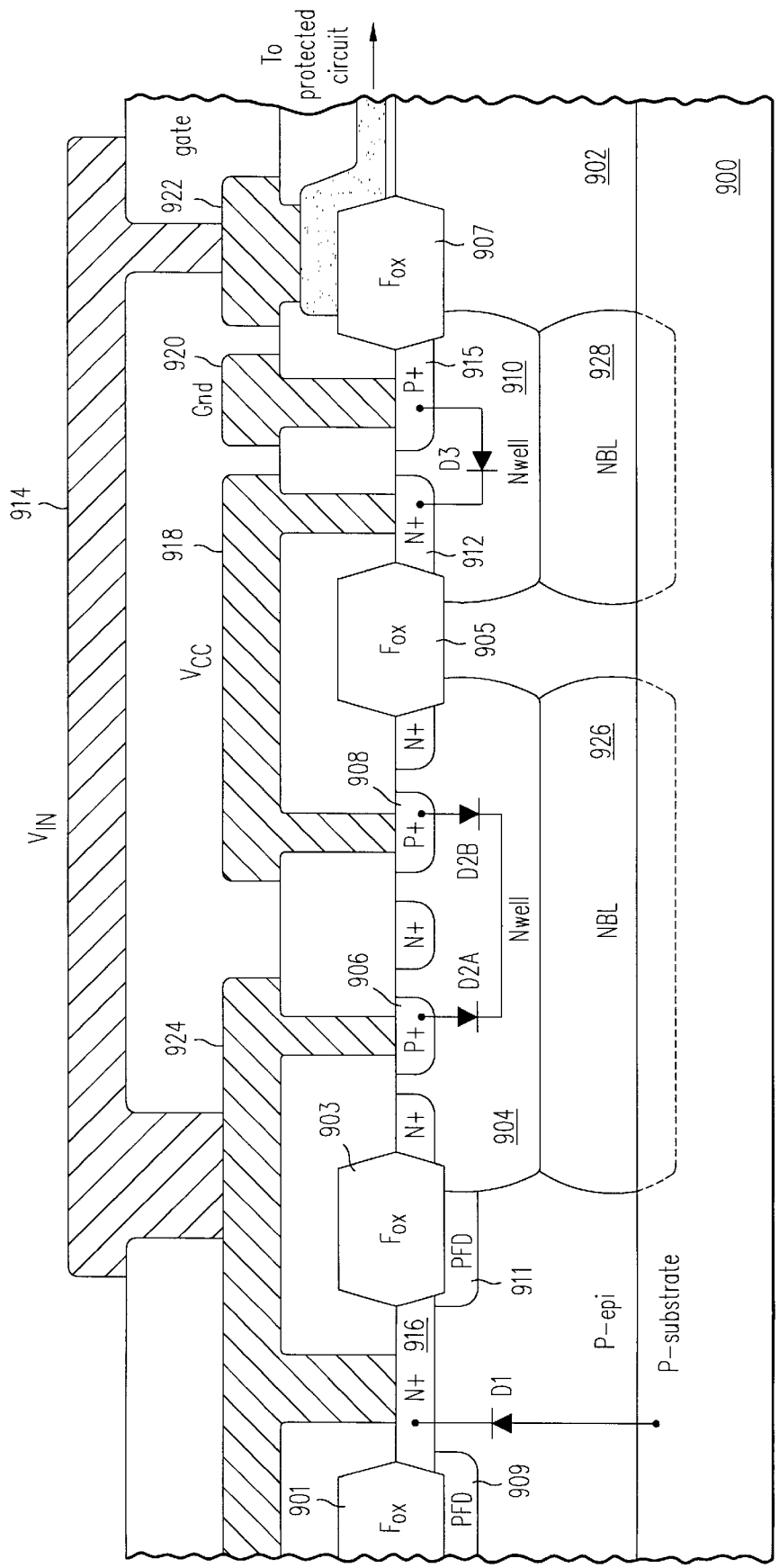
FIG. 9A illustrates a cross-sectional view of an integrated circuit embodiment wherein the diodes are formed as P+ regions within an N-well.

In FIG. 9A, a P-epitaxial (epi) layer 902 is grown on a P substrate 900. Diodes D2A and D2B are formed with P+ regions 906 and 908 in an N-well 904. Diode D1 is formed using an N+ region 916, and diode D3 is formed with a P+ region 915 in a second N-well 910. P substrate 900 is grounded. N+ region 916 (cathode of diode D1) and P+ region 906 (anode of diode D2A) are connected via a metal layer 924 which makes contact with an upper metal layer 914 to which $V_{IN}$ is connected. This design can also be implemented in single layer metal processes through an interdigital layout or in multiple layer metal processes. The supply voltage $V_{CC}$ is delivered to P+ region 908 (anode of diode D3) and N+ contact region 912 (cathode of diode D3) through a metal layer 918. P+ region 915 (anode of diode D3) is connected to ground by metal layer 920. Metal layer 914 is also connected to the protected circuit (shown as the gate of a transistor) by a metal contact 922. Since diodes D2A and D2B share a common cathode (N-well 904) an optional N buried layer 926 is formed under N-well 904 to suppress or control any parasitic PNP bipolar action either laterally or vertically. A similar optional N buried layer 928 is formed under N-well 910.

The breakdown voltage of diode D1 is controlled by the dopant concentration in P-epi layer 902 and by the lateral diffusion of P-type dopant from dopant from the P-field dopant (PFD) regions 909 and 911 under the cathode. PFD regions are normally formed in conjunction with the formation of the field oxide regions 901 and 903. The avalanche breakdown voltages of the diodes D2A and D2B and diode D3 are controlled by the dopant concentration in the N-wells 904 and 910, respectively, or the possible introduction of N-type field dopant from the field oxide regions touching or surrounding the isolated anodes of these diodes.

Figure 9B:
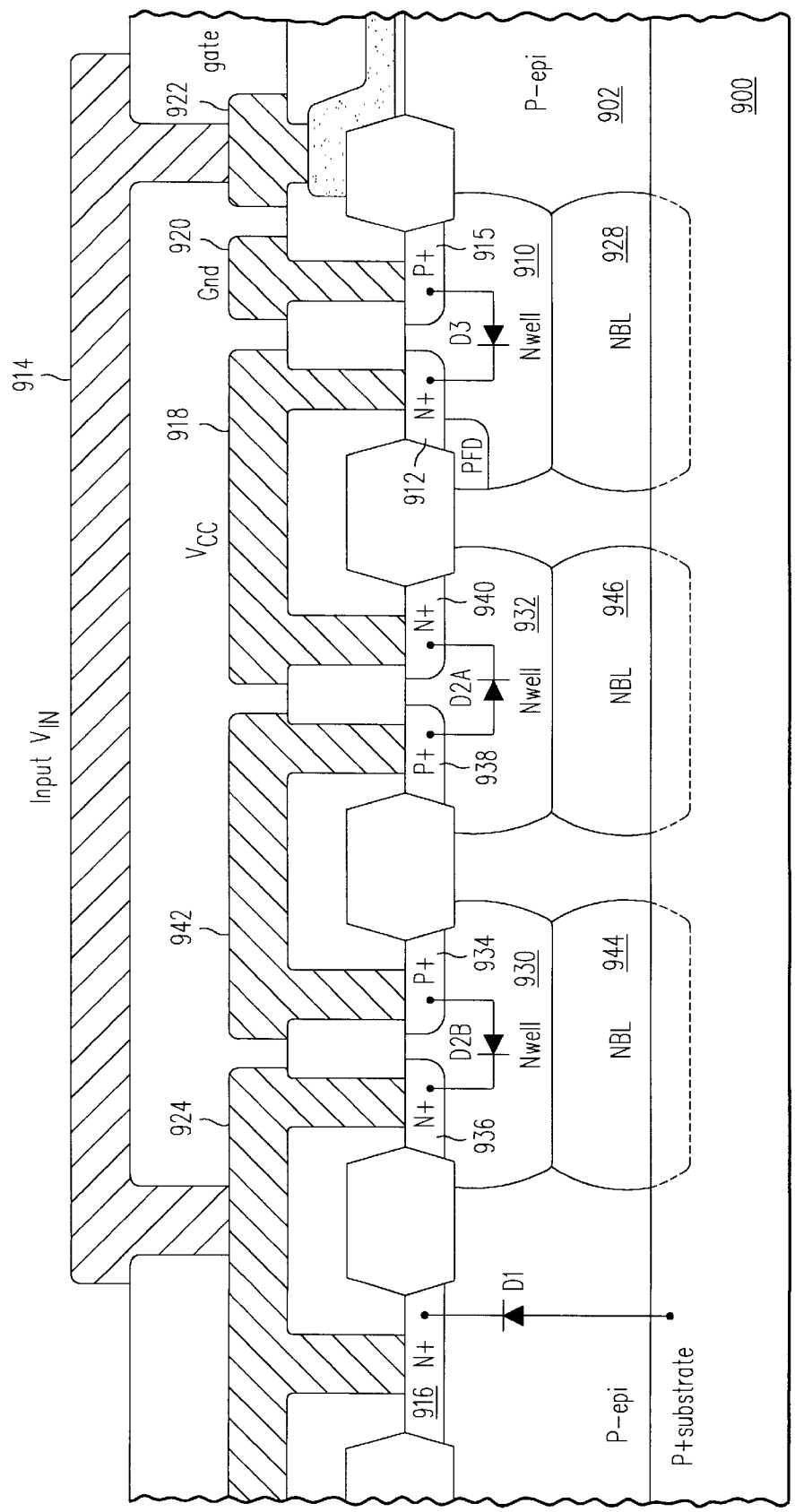
FIG. 9B illustrates a cross-sectional view of an integrated circuit embodiment wherein each of the diodes is formed as P+ region which forms a PN junction with an N-well.

The embodiment shown in FIG. 9B is similar to that shown in FIG. 9A, except that diodes D2A and D2B are formed in separate N-wells 932 and 930, respectively. A metal layer 942 connects P+ region 934 (anode of diode D2B) and P+ region 938 (anode of diode D2A). $V_{IN}$ is supplied to N+ region 936 (cathode of diode D2B) via metal layer 924, and $V_{CC}$ is supplied to N+ region 940 (cathode of diode D2A) via metal layer 918. Separate optional N buried layers 944 and 946 are formed under N-wells 930 and 932, respectively. In FIG. 9B the parasitic lateral PNP bipolar transistor is eliminated, but the N buried layers 944 and 946 are still needed to suppress parasitic vertical PNP bipolar action.

Figure 9C:
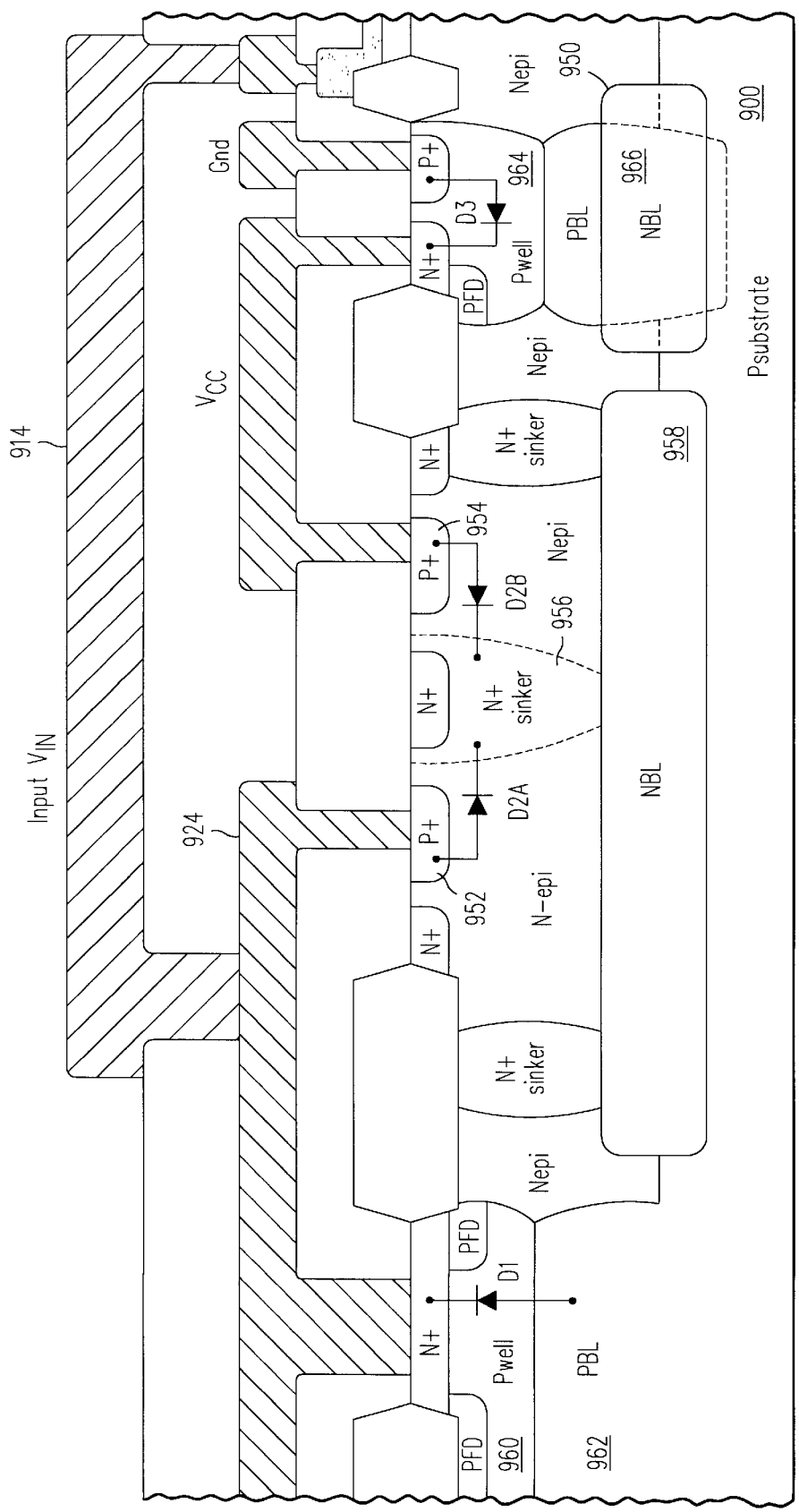
FIG. 9C illustrates a cross-sectional view of an integrated circuit embodiment wherein the diodes are formed as P+ regions within an N-epitaxial layer.
Figure 9D:
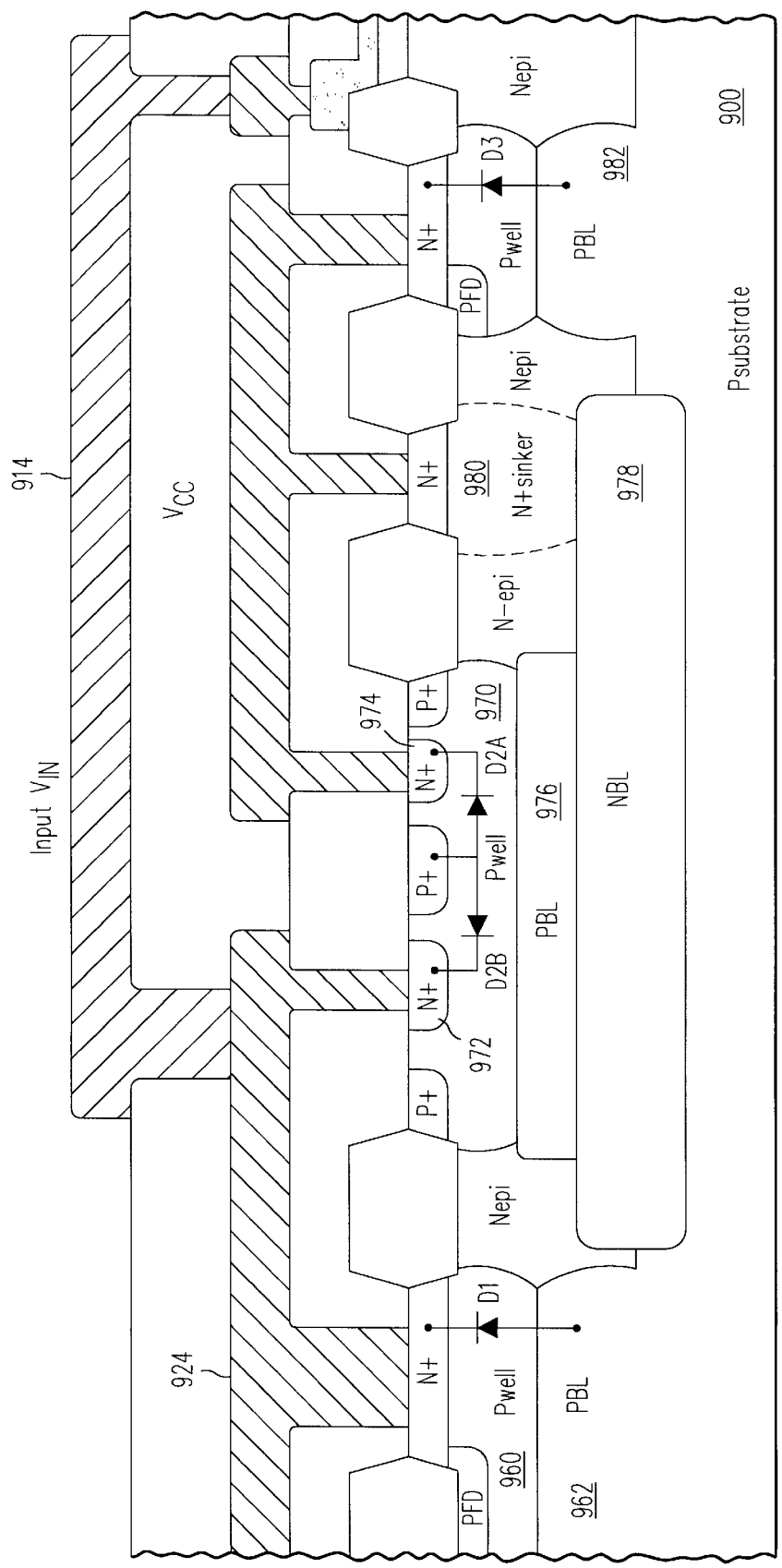
FIG. 9D illustrates a cross-sectional view of an integrated circuit embodiment wherein the diodes are formed as N+ regions within a P-well.

In the embodiment of FIG. 9C the diodes D2A and D2B are formed in an N-epi layer 950. P+ regions 952 and 954 form the anodes of diodes D2A and D2B, respectively. An N+ sinker 956 is interposed at the cathodes of diodes D2A and D2B to inhibit parasitic lateral bipolar action if it creates a snapback problem. An N buried layer 958 is preferably formed below diodes D2A and D2B. Diode D1 is formed in a P-well 960 that is connected to the P substrate 900 via a P buried layer 962. Diode D3 is formed in a P-well 964 which is isolated from the P substrate 900 by an N buried layer 966. This is done on the assumption that diode D3 will carry current, since it is preferable not to have current flow through the P substrate 900. If it is not contemplated that current will flow through diode D3, then P-well 964 could be connected to the P substrate 900. Similarly, it is better not to form diode D1 in the P substrate 900 (as shown in FIG. 9C) if it is anticipated that diode D1 will carry current. Instead, in this event it is preferable to construct diode D1 in the manner that diode D3 is formed.

The embodiment of FIG. 9D again has N-epi layer 950 grown on P substrate 900. Diodes D2A and D2B are formed as N+ regions 972 and 974 in a P-well 970. P-well 970 sits atop a P buried layer 976 which itself is located over an N buried layer 978. This type of structure is common in a BiCMOS process and results in two parasitic bipolar transistors: a lateral NPN comprising N+ regions 972 and 974, and a vertical NPN comprising the N buried layer 978 which is connected to $V_{CC}$ via the N+ sinker 980. The structure of diode D1 is similar to that of the embodiment shown in FIG. 9C, but the anode of diode D3 is connected to the P substrate 900 via a P buried layer 982.

Figure 9E:
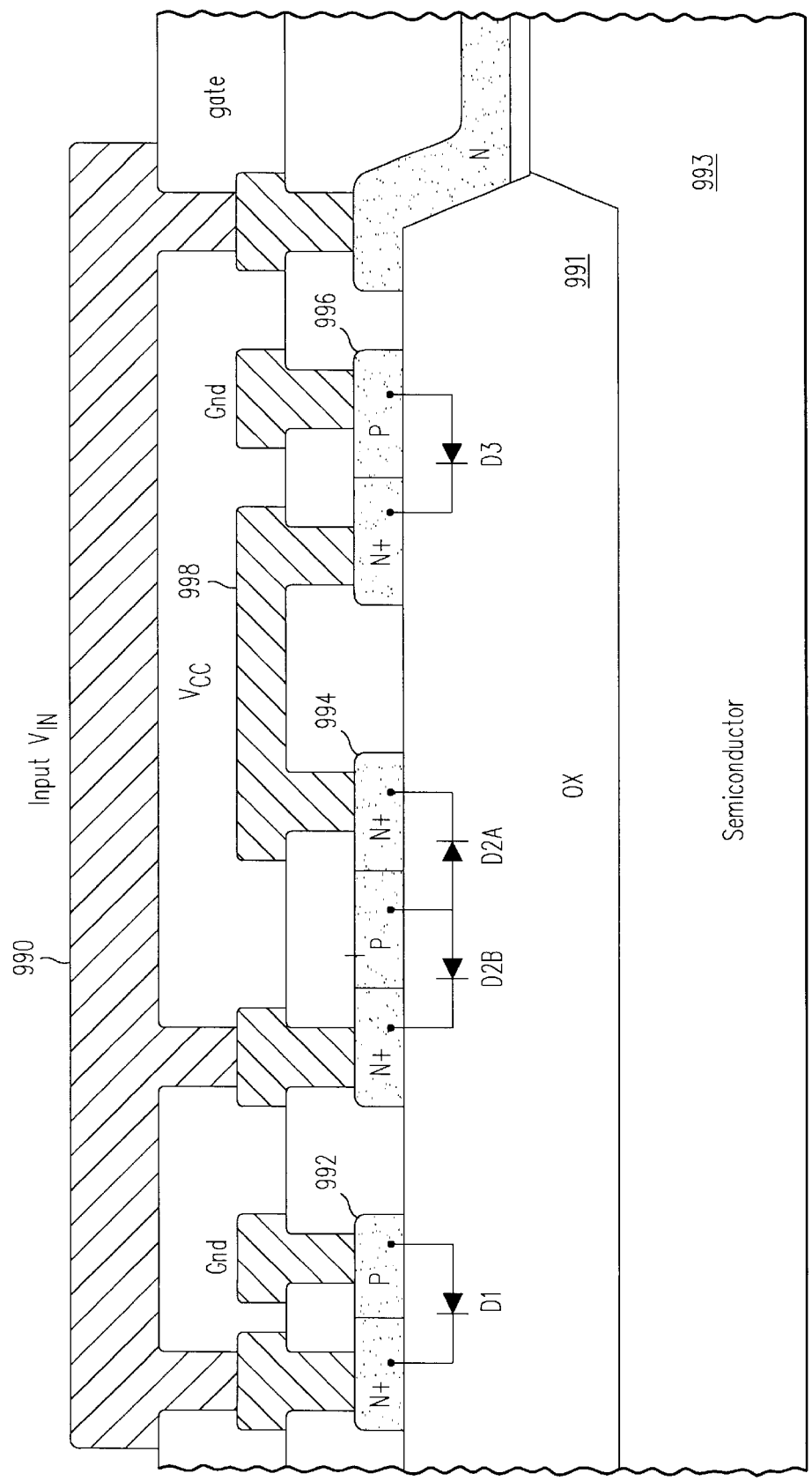
FIG. 9E illustrates a cross-sectional view of an integrated circuit embodiment wherein the diodes are formed in a polysilicon layer over a field oxide region.
Figure 10A:
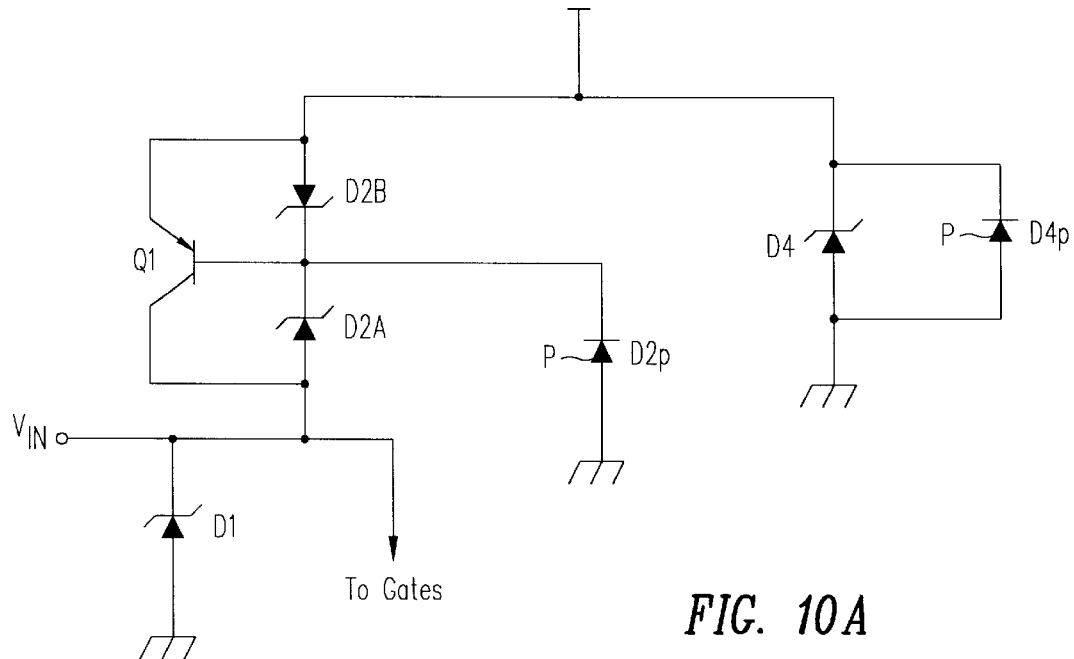
FIGS. 10A–10D are equivalent circuit diagrams for the embodiments shown in FIGS. 9A–9D, respectively.
Figure 10B:
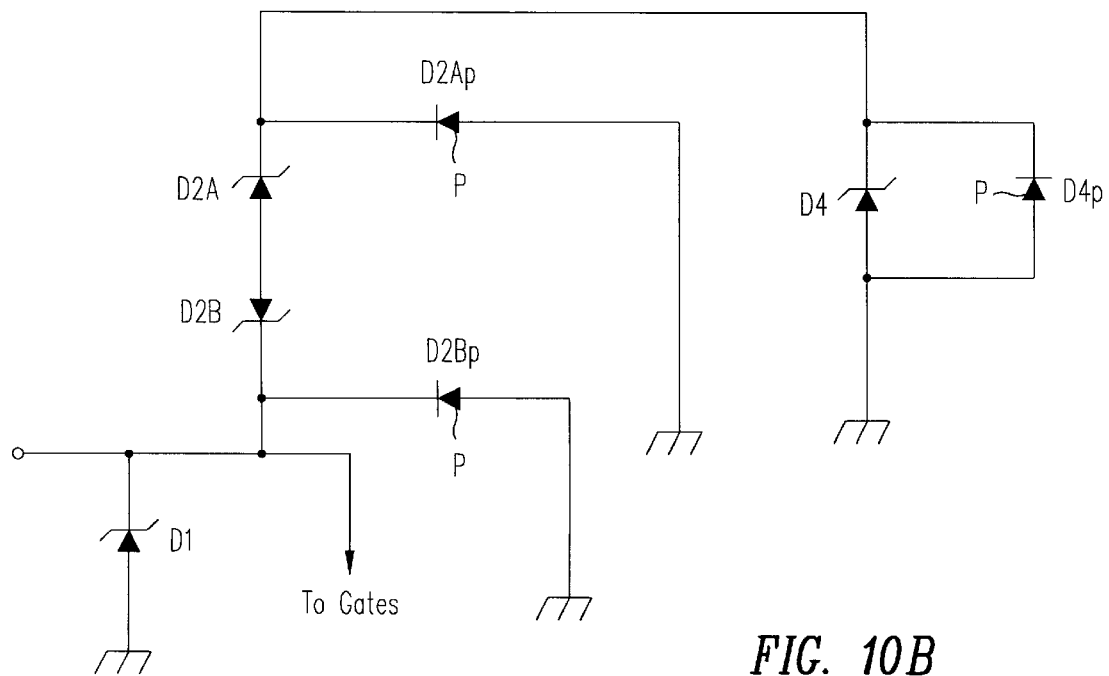
Figure 10C:
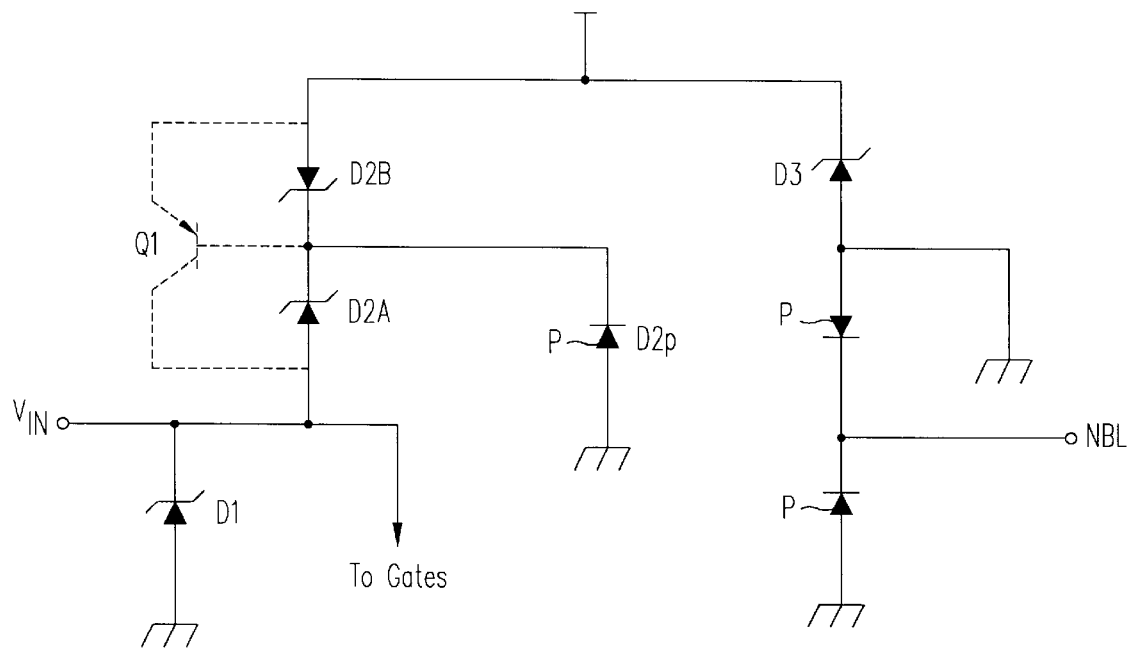
Figure 10D:
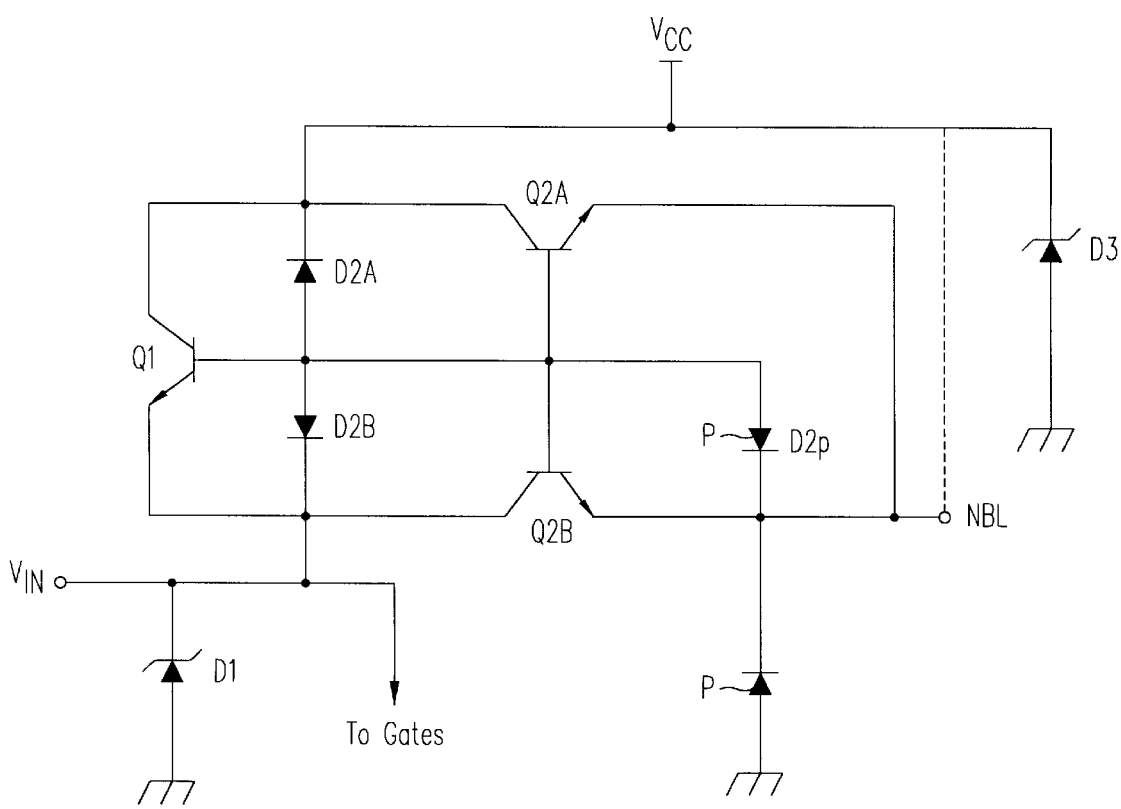

The diodes may also be formed in polysilicon. FIG. 9E shows an embodiment in which diode D1 is formed in a polysilicon layer 992, diodes D2A and D2B are formed in a polysilicon layer 994, and diode D3 is formed in a polysilicon layer 996. Polysilicon layers 992, 994 and 996 are located over a field oxide region 991, which is formed at a top surface of a semiconductor substrate 993. A metal layer 990 which carries $V_{IN}$ contacts the cathodes of diodes D1 and D2B and the gate of a MOSFET (not shown) which is shown as overlapping the top surface of the field oxide region 991. $V_{CC}$ is brought to the cathodes of diodes D2A and D3 by a metal layer 998, and the anodes of diodes D1 and D3 are connected to ground.

FIGS. 10A–10D show diagrams of equivalent circuits of the embodiments shown in FIGS. 9A–9D, respectively. The diodes labeled with the letter "p" are normally parasitic to conventional IC processes.

FIGS. 11A–11G are top views of various structures for diodes D2A and D2B. In each case the single-hatched areas are P-type, the cross-hatched areas are N+ type, and the clear areas are N-type. It will be understood, however, that these polarities can be reversed. The contacts are not shown in FIGS. 11A–11G, but it each case there are contacts which make electrical contact with the P-type regions which serve as the anodes of diode D2A and D2B. Generally, there is also a "base contact" which makes electrical contact with the N+ region. In general, the contacts and metalization cover as much of the diffusion as possible to force the diode to an equipotential along its entire periphery. In the case of diodes containing parasitic bipolar transistors the areas of contact and metal shorts can be reduced to vary the base resistance and thereby control the current at which the bipolar transistor snaps back.

Figure 11A:
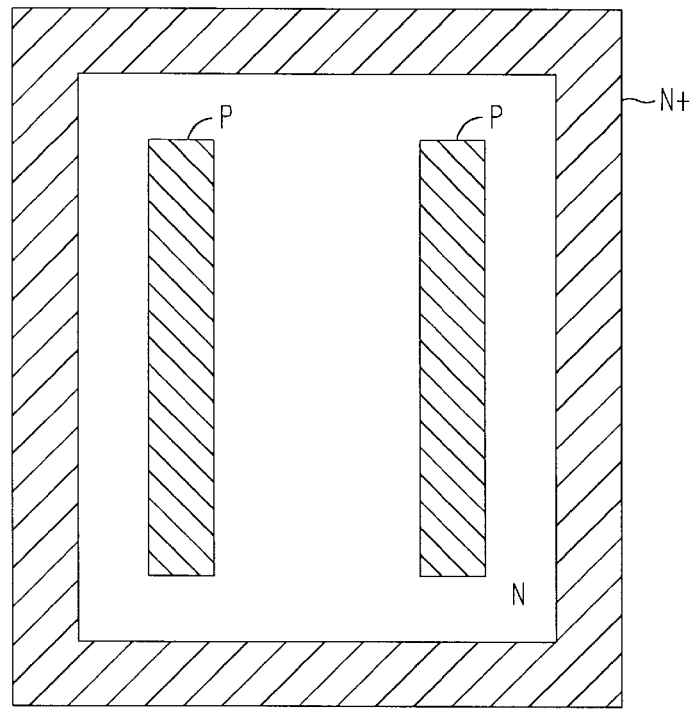
FIGS. 11A–11G illustrate top views of various configurations of the diodes in integrated form.
Figure 11B:
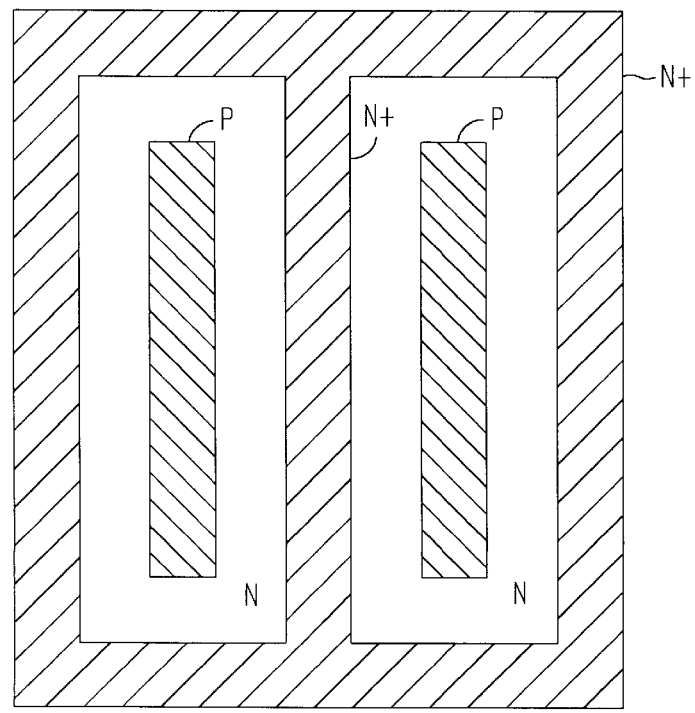
Figure 11C:
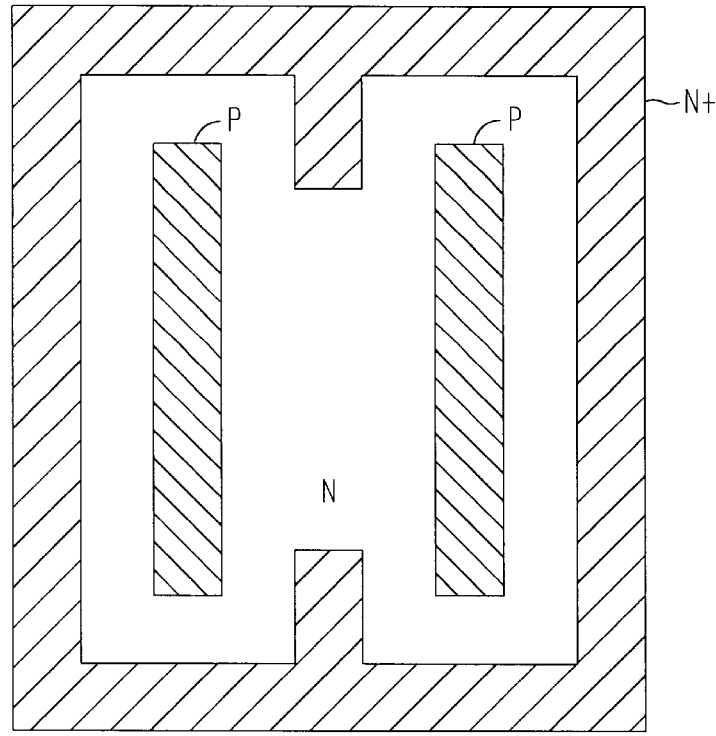
Figure 11D:
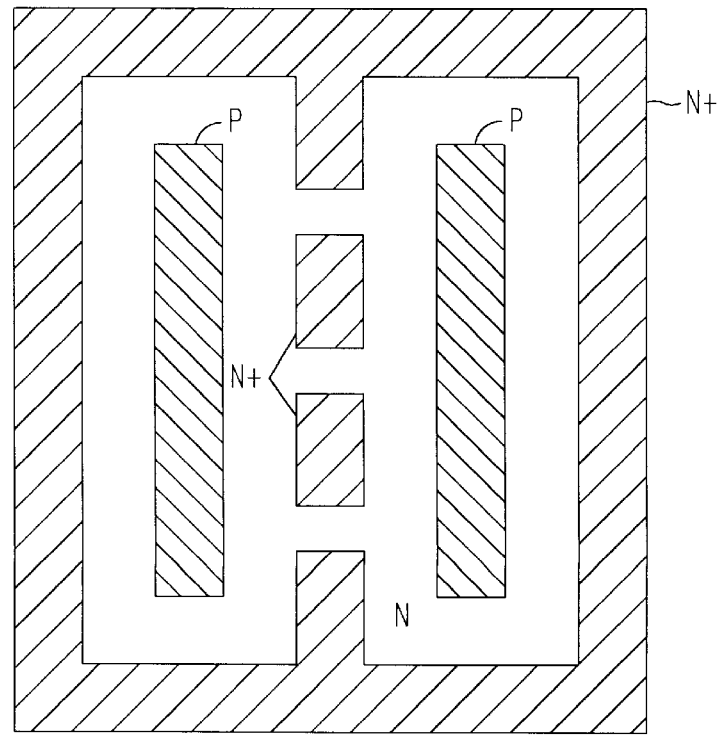

In FIG. 11A the anodes of diodes D2A and D2B are shown as P-type regions in a N-well or N-epi region, surrounded by a heavily doped N+ ring. This would allow parasitic PNP action but the N+ ring would help to contain the carriers. FIG. 11B is similar but here the N+ ring is brought between the P-type regions to intentionally suppress bipolar action. FIG. 11C is an intermediate structure where the N+ ring is brought partially between the P-type regions to suppress some the bipolar action. FIG. 11D is another similar structure where the N+ ring is segmented between the P-type regions to help suppress bipolar action.

Figure 11E:
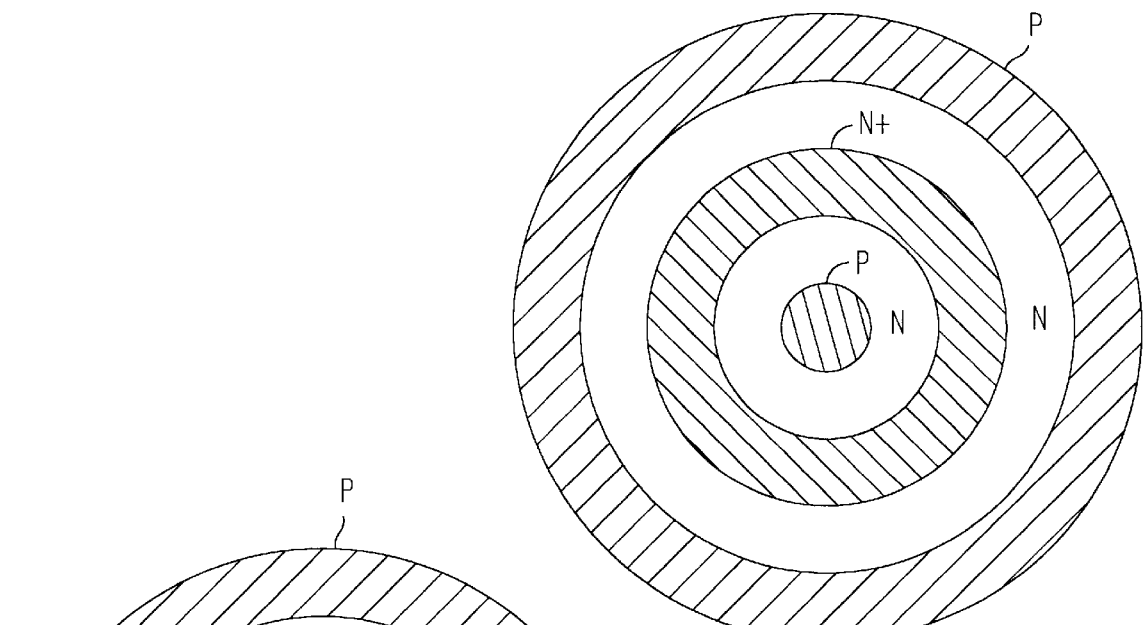
Figure 11F:
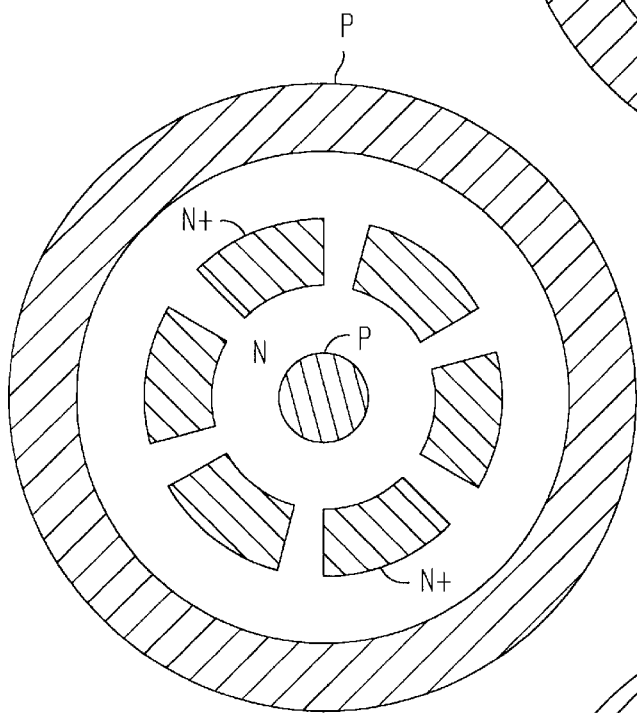

FIG. 11E illustrates a circular version where a heavily doped N+ ring is interposed between the two anode P-type rings. The N+ ring partially suppresses bipolar action even if it is not contacted. FIG. 11F shows an intermediate version wherein the N+ ring in segmented to limit the degree of bipolar suppression.

Figure 11G:
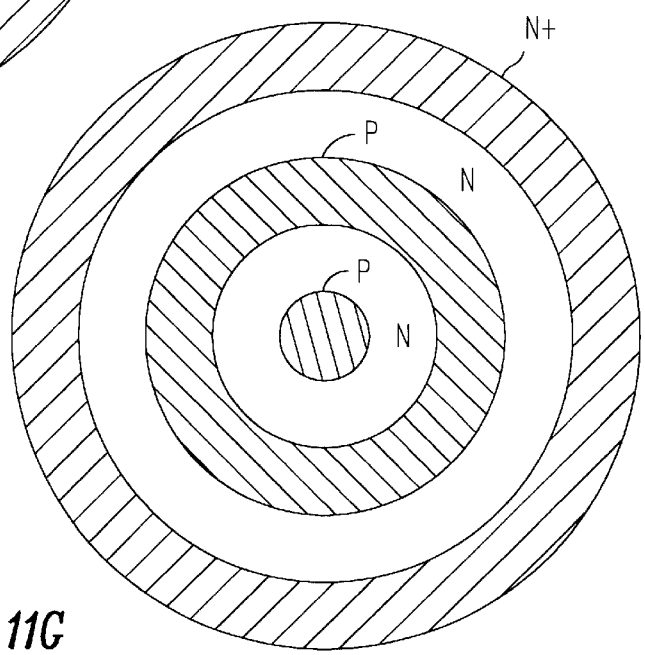

FIG. 11G shows another circular version where the P-type anodes face each other and are inside the N+ ring, thereby amplifying the bipolar action but containing the minority carriers of the bipolar near the surface within the N+ ring. In FIGS. 11A–11F the parasitic bipolar could be either horizontal or vertical (assuming that there is a buried layer to act as the emitter or collector in a vertical device).

Figure 12:
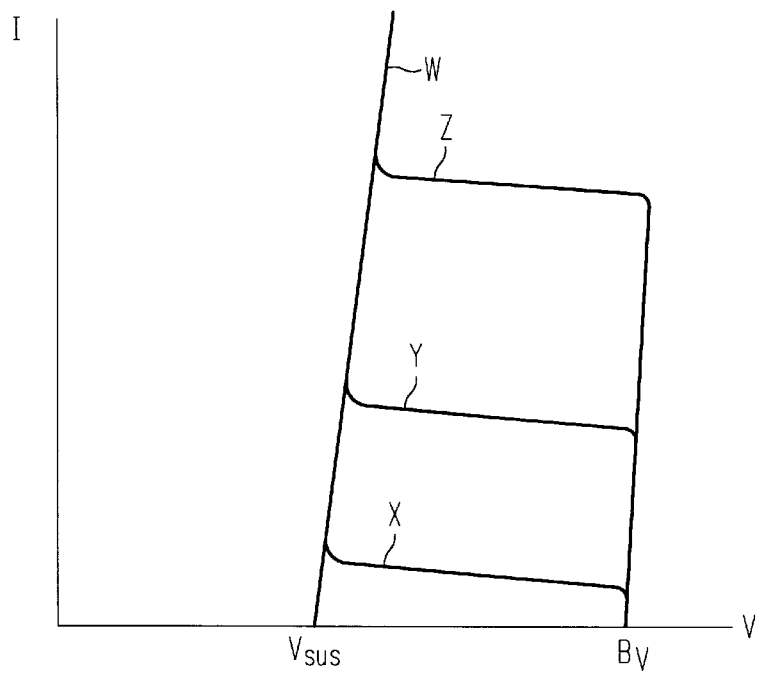
FIG. 12 illustrates a graph showing how the bipolar action of the diodes can be adjusted to affect their snapback characteristics.

FIG. 12 illustrates a graph showing the variations in characteristics that can be obtained by changing the bipolar action of the diodes D2A and D2B. Curves x, y and z show the current-voltage characteristic of the parasitic bipolar as the bipolar action is increased by increasing the base contact area. The current at which the device snaps back to the sustaining voltage $V_{sus}$, increases as the bipolar action is amplified. Curve w shows the extreme case where there is no base contact and the device would snap back to $V_{sus}$ immediately upon breakdown. The area of the base contact electrically varies the resistance of the base. In the case represented by curve z, the contact is well distributed and the base resistance is low so that a high current can be reached before snapback ensues. In the case represented by curve x, the base resistance is high, and little current is needed to initiate snapback. The case represented by curve y is intermediate between the cases represented by curves x and z. In the case represented by curve w, the base is not contacted at all or contacted only through a very resistive path, and merely a leakage current is sufficient to drive the transistor into snapback.

Figure 13:
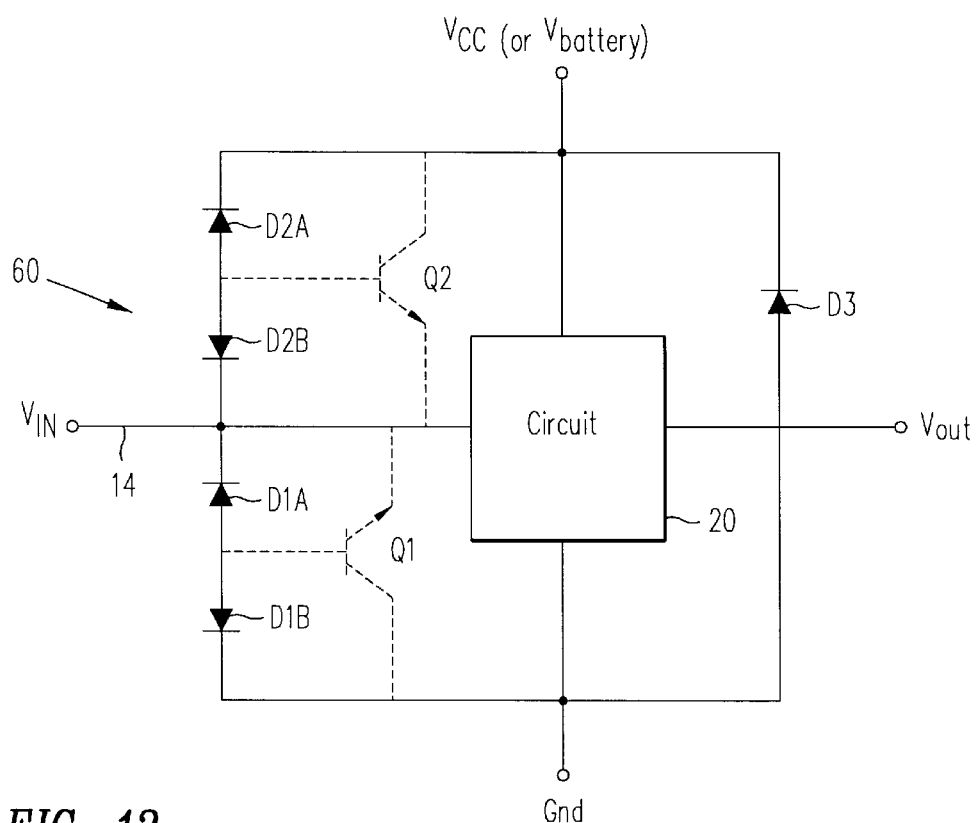
FIG. 13 illustrates a circuit diagram of an alternative embodiment which includes a second pair of diodes connected in series between the signal input terminal and ground.

The foregoing embodiments are illustrative and not limiting. Many additional embodiments will be apparent to those skilled in the art. For example, if it is desired to permit $V_{IN}$ to fall more than one diode drop below ground, diodes similar to diodes D2A and D2B can be connected between the input terminal and ground. Such an embodiment is shown in FIG. 13, wherein diodes D1A and D1B are connected between input terminal 14 and ground.

I claim:

1. An electrostatic discharge (ESD) protection circuit comprising
   a signal input terminal for delivering an input signal to a second circuit to be protected by said ESD protection circuit;
   a power supply terminal;
   first and second diodes connected in series between said signal input terminal and said power supply terminal, said first and second diodes being connected with their respective forward current flow directions opposed;
   a third diode connected between said signal input terminal and ground; and
   a fourth diode connected between said power supply terminal and ground, wherein said first and second diodes comprise a layer of polysilicon, said layer of polysilicon comprising a first region of a first conductivity type, a second region of a second conductivity type, and a third region of said first conductivity type, said second region forming a PN junction with each of said first and third regions.

2. The ESD protection circuit of claim 1 wherein said signal input terminal is connected to said first region and said power supply terminal is connected to said third region.

3. The ESD protection circuit of claim 2 wherein said polysilicon layer is formed over a field oxide region.

4. An electrostatic discharge protection circuit formed as an integrated circuit chip, the chip comprising:
   a first region of a first conductivity type;
   a second region of a second conductivity type adjoining a first surface of the chip, the second region forming a first PN junction diode with the first region;
   a third region of the second conductivity type separated from the second region and adjoining the first surface of the chip and enclosing a fourth region of the first conductivity type and a fifth region of the first conductivity type, the fourth and fifth regions adjoining the first surface, the fourth region forming a second PN junction diode with the third region and the fifth region forming a third PN junction diode with the third region;
   a sixth region of the first conductivity type and a seventh region of the second conductivity type, the sixth and seventh regions being separated from the second and third regions and adjoining the first surface, the sixth region forming a fourth PN junction diode with the seventh region;
   a first metal layer connecting the second and fourth regions;
   a second metal layer connecting the fifth and seventh regions;
   a third metal layer connecting the first and sixth regions; and
   a fourth metal layer for carrying an input signal and connecting the first metal layer to a circuit to be protected by the electrostatic discharge protection circuit.

5. The electrostatic discharge protection circuit of claim 4 wherein the chip comprises a substrate and an epitaxial layer overlying the substrate, the first region comprising at least a portion of the substrate and a first portion of the epitaxial layer, the first portion of the epitaxial layer being doped with a dopant of the first conductivity type to a concentration lower than a concentration of the dopant of the first conductivity type in the substrate.

6. The electrostatic discharge protection circuit of claim 5 wherein the third region comprises a first well of the second conductivity type in the epitaxial layer.

7. The electrostatic discharge protection circuit of claim 6 wherein the seventh region comprises a second well of the second conductivity type in the epitaxial layer.

8. The electrostatic discharge protection circuit of claim 7 comprising a first buried layer of the second conductivity type beneath the first well, the first buried layer being doped with a dopant of the second conductivity type to a concentration higher than a concentration of the dopant of the second conductivity type in the first well.

9. The electrostatic discharge protection circuit of claim 8 comprising a second buried layer of the second conductivity type beneath the second well, the second buried layer being doped with a dopant of the second conductivity type to a concentration higher than a concentration of the dopant of the second conductivity type in the second well.

10. The electrostatic discharge protection circuit of claim 9 wherein each of the first and second buried layers extends into the substrate.

11. The electrostatic discharge protection circuit of claim 5 wherein the first region comprises a first well of the first conductivity type in the epitaxial layer, the first PN junction diode being located at a junction between the first well and the second region.

12. The electrostatic discharge protection circuit of claim 11 wherein the first region comprises a first buried layer of the first conductivity type, the first buried layer extending between the substrate and the first well.

13. The electrostatic discharge protection circuit of claim 12 wherein the third region is located in the epitaxial layer, the third region being bounded laterally by a first sinker region of the second conductivity type, the first sinker region being doped with a dopant of the second conductivity type to a concentration greater than a concentration of the a dopant of the second conductivity type in the third region.

14. The electrostatic discharge protection circuit of claim 13 comprising a first buried layer of the second conductivity type located beneath the third region, the first buried layer being doped with a dopant of the second conductivity type to a concentration greater than a concentration of the a dopant of the second conductivity type in the third region.

15. The electrostatic discharge protection circuit of claim 14 wherein the first sinker region adjoins the first buried layer.

16. An electrostatic discharge protection circuit formed as an integrated circuit chip, the chip comprising:
   a first region of a first conductivity type;
   a second region of a second conductivity type adjoining a first surface of the chip, the second region forming a first PN junction diode with the first region;
   a third region of the second conductivity type and a fourth region of the first conductivity type, the third and fourth regions adjoining the first surface and being separated from the second region, the fourth region forming a second PN junction diode with the third region;

a fifth region of the first conductivity type and a sixth region of the second conductivity type, the fifth and sixth regions adjoining the first surface and being separated from the second, third and fourth regions, the fifth region forming a third PN junction diode with the sixth region;

a seventh region of the second conductivity type and an eighth region of the first conductivity type, the seventh and eighth regions being separated from the second, third, fourth and fifth regions and adjoining the first surface, the seventh region forming a fourth PN junction diode with the eighth region;

a first metal layer connecting the second and third regions;

a second metal layer connecting the fourth and fifth regions;

a third metal layer connecting the sixth and seventh regions; and a fourth metal layer for carrying an input signal and connecting the first metal layer to a circuit to be protected by the electrostatic discharge protection circuit.

17. The electrostatic discharge protection circuit of claim 16 wherein the chip further comprises a substrate and an epitaxial layer overlying the substrate, wherein the third region comprises a first well of second conductivity type formed in the epitaxial layer.

18. The electrostatic discharge protection circuit of claim 17 wherein the sixth region comprises a second well of second conductivity type formed in the epitaxial layer.

19. The electrostatic discharge protection circuit of claim 18 wherein the seventh layer comprises a third well of second conductivity type formed in the epitaxial layer.

20. The electrostatic discharge protection circuit of claim 19 comprising a first buried layer of the second conductivity type beneath the first well, the first buried layer being doped with a dopant of the second conductivity type to a concentration higher than a concentration of the dopant of the second conductivity type in the first well.

21. The electrostatic discharge protection circuit of claim 20 comprising a second buried layer of the second conductivity type beneath the second well, the second buried layer being doped with a dopant of the second conductivity type to a concentration higher than a concentration of the dopant of the second conductivity type in the second well.

22. The electrostatic discharge protection circuit of claim 21 comprising a third buried layer of the second conductivity type beneath the third well, the third buried layer being doped with a dopant of the second conductivity type to a concentration higher than a concentration of the dopant of the second conductivity type in the third well.

23. An electrostatic discharge protection circuit formed as an integrated circuit chip, the chip comprising:

a first region of a first conductivity type adjoining a first surface of the chip;

a second region of a second conductivity type, the second region forming a first PN junction diode with the first region;

a third region of the second conductivity type separated from the second region and adjoining the first surface of the chip and enclosing a fourth region of the first conductivity type and a fifth region of the first conductivity type, the fourth and fifth regions adjoining the first surface, the fourth region forming a second PN junction diode with the third region and the fifth region forming a third PN junction diode with the third region;

a sixth region of the first conductivity type adjoining the first surface;

a seventh region of the second conductivity type, the seventh region being separated from the second and third regions, the sixth region forming a fourth PN junction diode with the seventh region;

a first metal layer connecting the first and fourth regions;

a second metal layer connecting the fifth and sixth regions;

a third metal layer for carrying an input signal and connecting the first metal layer to a circuit to be protected by the electrostatic discharge protection circuit.

24. The electrostatic discharge protection circuit of claim 23 wherein the chip comprises a substrate and an epitaxial layer overlying the substrate, and the second region comprises a first well of the second conductivity type in the epitaxial layer.

25. The electrostatic discharge protection circuit of claim 24 wherein the third region comprises a second well of the second conductivity type in the epitaxial layer.

26. The electrostatic discharge protection circuit of claim 25 wherein the seventh region comprises a third well of the second conductivity type in the epitaxial layer.

27. The electrostatic discharge protection circuit of claim 26 comprising a first buried layer of the second conductivity type beneath the first well, the first buried layer being doped with a dopant of the second conductivity type to a concentration higher than a concentration of the dopant of the second conductivity type in the first well.

28. The electrostatic discharge protection circuit of claim 27 comprising a second buried layer of the second conductivity type beneath the second well, the second buried layer being doped with a dopant of the second conductivity type to a concentration higher than a concentration of the dopant of the second conductivity type in the second well.

29. The electrostatic discharge protection circuit of claim 28 comprising a third buried layer of the second conductivity type beneath the third well, the third buried layer being doped with a dopant of the second conductivity type to a concentration higher than a concentration of the dopant of the second conductivity type in the third well.

30. The electrostatic discharge protection circuit of claim 28 further comprising:

a buried layer of the first conductivity type beneath the second buried layer of second conductivity type; and a sinker region of first conductivity type connecting the buried layer of the first conductivity type to the second metal layer.

* * * * *